United States Patent
Yonezawa et al.

(10) Patent No.: US 9,251,055 B2
(45) Date of Patent: Feb. 2, 2016

(54) MEMORY SYSTEM AND CONTROL METHOD OF MEMORY SYSTEM

(75) Inventors: Shinji Yonezawa, Tokyo (JP); Takashi Hirao, Tokyo (JP); Hirokuni Yano, Tokyo (JP); Mitsunori Tadokoro, Kanagawa (JP); Hiroki Matsudaira, Kanagawa (JP); Akira Sawaoka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 13/599,087

(22) Filed: Aug. 30, 2012

(65) Prior Publication Data
US 2013/0232296 A1   Sep. 5, 2013

(30) Foreign Application Priority Data

Feb. 23, 2012 (JP) .................................. 2012-037965
Mar. 16, 2012 (JP) .................................. 2012-060698
Mar. 26, 2012 (JP) .................................. 2012-068868

(51) Int. Cl.
*G06F 12/02* (2006.01)

(52) U.S. Cl.
CPC .... *G06F 12/0246* (2013.01); *G06F 2212/7205* (2013.01); *G06F 2212/7209* (2013.01); *G11C 2211/5641* (2013.01)

(58) Field of Classification Search
None
See application file for complete search history.

(56) References Cited

U.S. PATENT DOCUMENTS

| | | | |
|---|---|---|---|
| 6,349,358 B1 * | 2/2002 | Kuwata | 711/113 |
| 6,629,095 B1 * | 9/2003 | Wagstaff et al. | |
| 7,778,259 B1 * | 8/2010 | Mahalingaiah | 370/401 |
| 7,949,910 B2 | 5/2011 | Kanno et al. | |
| 7,953,920 B2 | 5/2011 | Yano et al. | |
| 7,958,411 B2 | 6/2011 | Kanno et al. | |
| 7,962,688 B2 | 6/2011 | Yano et al. | |
| 8,015,347 B2 | 9/2011 | Kitsunai et al. | |

(Continued)

FOREIGN PATENT DOCUMENTS

| | | |
|---|---|---|
| JP | 2001-142774 | 5/2001 |
| JP | 2008-257773 | 10/2008 |

(Continued)

OTHER PUBLICATIONS

Jerry et.al. "Architectural Support for Translation Table Management in Large Address Space Machines" IEEE 1993 section 2.*

(Continued)

*Primary Examiner* — Yaima Rigol
*Assistant Examiner* — Tasnima Matin
(74) *Attorney, Agent, or Firm* — Oblon, McClelland, Maier & Neustadt, L.L.P.

(57) ABSTRACT

A memory system in embodiments includes a nonvolatile semiconductor memory that stores user data, a forward lookup address translation table and a reverse lookup address translation table, and a controller. The controller is configured to determine that the user data stored in the nonvolatile semiconductor memory is valid or invalid based on these two tables. The controller may perform data organizing of selecting data determined valid and rewriting the data in a new block. The controller may perform write processing and rewriting processing to the new block alternately at a predetermined ratio. The controller may determine whether a predetermined condition is satisfied on a basis of addresses included in write requests and write data in the MLC mode when the condition is satisfied and write data in the SLC mode when the condition is not satisfied.

19 Claims, 26 Drawing Sheets

(56) References Cited

U.S. PATENT DOCUMENTS

| | | |
|---|---|---|
| 8,060,797 B2 | 11/2011 | Hida et al. |
| 8,065,470 B2 | 11/2011 | Yano et al. |
| 8,065,471 B2 | 11/2011 | Yano et al. |
| 8,108,594 B2 | 1/2012 | Yano et al. |
| 8,219,861 B2 | 7/2012 | Hida et al. |
| 8,225,047 B2 | 7/2012 | Yano et al. |
| 8,225,058 B2 | 7/2012 | Miyamoto et al. |
| 8,266,396 B2 | 9/2012 | Yano et al. |
| 8,276,043 B2 | 9/2012 | Yano et al. |
| 2002/0052726 A1 | 5/2002 | Tajima et al. |
| 2005/0273574 A1* | 12/2005 | Lin .................. 711/207 |
| 2006/0259744 A1* | 11/2006 | Matthes ............ 712/220 |
| 2007/0016719 A1 | 1/2007 | Ono et al. |
| 2007/0255924 A1* | 11/2007 | Moyer et al. ........ 711/202 |
| 2008/0104309 A1* | 5/2008 | Cheon et al. ........ 711/103 |
| 2008/0239811 A1 | 10/2008 | Tanaka |
| 2008/0250220 A1 | 10/2008 | Ito |
| 2009/0222616 A1* | 9/2009 | Yano et al. ........ 711/103 |
| 2010/0161885 A1 | 6/2010 | Kanno et al. |
| 2010/0169549 A1 | 7/2010 | Yano et al. |
| 2010/0169551 A1* | 7/2010 | Yano et al. ........ 711/103 |
| 2010/0169553 A1 | 7/2010 | Yano et al. |
| 2010/0169597 A1 | 7/2010 | Yonezawa et al. |
| 2010/0180145 A1* | 7/2010 | Chu .................. 714/2 |
| 2010/0223424 A1 | 9/2010 | Kitsunai et al. |
| 2010/0223447 A1* | 9/2010 | Serebrin ............ 712/225 |
| 2010/0235564 A1* | 9/2010 | Ito .................. 711/103 |
| 2010/0332787 A1* | 12/2010 | Grohoski et al. ....... 711/207 |
| 2011/0022784 A1 | 1/2011 | Yano et al. |
| 2011/0173380 A1 | 7/2011 | Yano et al. |
| 2011/0185105 A1* | 7/2011 | Yano et al. ........ 711/103 |
| 2011/0219177 A1 | 9/2011 | Kanno et al. |
| 2011/0231734 A1 | 9/2011 | Yano et al. |
| 2011/0238899 A1 | 9/2011 | Yano et al. |
| 2011/0314204 A1 | 12/2011 | Ootsuka et al. |
| 2012/0033496 A1 | 2/2012 | Yano et al. |
| 2012/0159046 A1 | 6/2012 | Norimatsu et al. |
| 2012/0159050 A1 | 6/2012 | Yano et al. |
| 2012/0159058 A1 | 6/2012 | Yonezawa et al. |
| 2012/0159244 A1 | 6/2012 | Hirao et al. |
| 2012/0221776 A1 | 8/2012 | Yoshihashi et al. |
| 2012/0239992 A1 | 9/2012 | Hida et al. |
| 2012/0260023 A1 | 10/2012 | Nagai et al. |
| 2012/0260349 A1 | 10/2012 | Nagai et al. |

FOREIGN PATENT DOCUMENTS

| | | |
|---|---|---|
| JP | 2008-276733 | 11/2008 |
| JP | 2009-211225 | 9/2009 |
| JP | 4533968 | 6/2010 |
| JP | 2010-152778 | 7/2010 |
| JP | 4643667 | 12/2010 |
| WO | WO 2012/081730 A1 | 6/2012 |
| WO | WO 2012/081731 A1 | 6/2012 |

OTHER PUBLICATIONS

U.S. Appl. No. 12/646,100, filed Dec. 23, 2009, Yonezawa, et al.
U.S. Appl. No. 13/571,034, filed Aug. 9, 2012, Yano, et al.
U.S. Appl. No. 13/602,488, filed Sep. 4, 2012, Sawaoka, et al.
U.S. Appl. No. 13/609,991, filed Sep. 11, 2012, Hirao, et al.
U.S. Appl. No. 13/609,663, filed Sep. 11, 2012, Matsudaira, et al.
U.S. Appl. No. 13/616,466, filed Sep. 14, 2012, Kato, et al.
Office Action issued Jul. 8, 2014 in Japanese Patent Application No. 2012-060698 (with English language translation).
Japanese Office Action issued Jun. 17, 2014, in Japan Patent Application No. 2012-037965 (with English translation).

* cited by examiner

FIG.2

ADDRESS TRANSLATION TABLE 21

| CLUSTER ADDRESS (LBA) | STORAGE LOCATION (BLOCK NUMBER + INTRA-BLOCK STORAGE LOCATION) | DATA PRESENCE/ ABSENCE |
|---|---|---|
| 0 | | 1 |
| | | 0 |
| ⋮ | ⋮ | ⋮ |
| | | 1 |
| | | 1 |
| | | 0 |
| ⋮ | ⋮ | ⋮ |
| | | 1 |
| ⋮ | ⋮ | ⋮ |

FIG.3

BLOCK MANAGEMENT TABLE 22

| BLOCK NUMBER | USED/ UNUSED | BAD BLOCK FLAG |
|---|---|---|
| | | |
| | | |
| | | |
| ⋮ | ⋮ | ⋮ |

MEMORY SYSTEM AND CONTROL METHOD OF MEMORY SYSTEM

CROSS-REFERENCE TO RELATED APPLICATIONS

This application is based upon and claims the benefit of priority from Japanese Patent Application No. 2012-037965, filed on Feb. 23, 2012, Japanese Patent Application No. 2012-060698, filed on Mar. 16, 2012, and Japanese Patent Application No. 2012-068868, filed on Mar. 26, 2012; the entire contents of all of which are incorporated herein by reference.

FIELD

Embodiments described herein relate generally to a memory system and a control method of a memory system.

BACKGROUND

In SSDs (solid state drive), when a data erasing unit (block) is different from a data management unit, according to the progress of rewriting of a flash memory, blocks are made porous by invalid (non-latest) data. When blocks in such a porous state increase, substantially usable blocks decrease and a storage area of the flash memory cannot be effectively used. Therefore, for example, when the number of free blocks (unused blocks which do not include valid data therein and for which a use is not allocated) of the flash memory becomes less than a predetermined threshold, the flash memory is organized, for example, by performing compaction of collecting valid data in blocks and rewriting the data in a different block, thereby reserving a free block for which a use is not allocated.

That means that a block having a small amount of valid data that is a target for the compaction can be released after moving the data, therefore, the number of free blocks can be increased by the compaction. In the compaction processing, it is needed to determine whether data in a movement source block is valid data or invalid data. Thus, it is needed to prepare a reverse lookup address translation table (translation table from NAND address into host address: Reverse Lookup Table) in a memory. A translation table from a host address into a NAND address is a forward lookup address translation table (Lookup Table).

If the compaction continues to be performed when a write request is input from a host device to an SSD, the response to the write request is delayed. If the compaction is not performed, for example, free blocks cannot be reserved, therefore, the compaction needs to be performed in some cases. However, when free blocks are present even if the compaction is not performed, it is desirable to prioritize the response to a write request.

Moreover, a recording method in a NAND flash memory includes a multi-value recording (MLC: Multi-Level Cell) method and a binary recording (SLC: Single-Level Cell) method. Whereas the SLC method (hereinafter, SLC mode) records 1 bit in one cell that is one unit for recording, the MLC method (hereinafter, MLC mode) can record N bits (N>1) in one cell. Therefore, for example, in a MLC flash memory that records 2 bits per cell, one cell can express four values, and, in a MLC flash memory that records 3 bits per cell, one cell can express eight values.

Thus, in the recording in the MLC mode, the recording capacity per volume can be increased compared with that in the recording in the SLC mode, and there is a merit that the cost per recording capacity can be suppressed. On the other hand, in the recording in the SLC mode, there is a merit that the access time in writing and reading is short and the reliability is high compared with the recording in the MLC mode.

BRIEF DESCRIPTION OF THE DRAWINGS

FIG. 2 is a diagram illustrating an address translation table;

FIG. 3 is a diagram illustrating a block management table;

DETAILED DESCRIPTION

According one embodiment of the present invention, a memory system includes a nonvolatile semiconductor memory and a controller. In the nonvolatile semiconductor memory, erasing is performed in units of blocks. The controller includes a write control unit that writes data from a host device in a block of the nonvolatile semiconductor memory and an organizing unit that determines whether each data stored in an organizing target block of the nonvolatile semiconductor memory is valid or invalid and performs data organizing of sequentially selecting data determined valid and rewriting the data in a new block, and performs write processing by the write control unit and rewriting to a new block by the organizing unit alternately at a predetermined ratio. While performing the data organizing corresponding to the predetermined ratio, when a result indicating that data is invalid in a valid/invalid determination continues a predetermined number of times, the organizing unit ends current valid/invalid determination processing.

A memory system and a control method of a memory system according to the embodiments will be explained in detail below with reference to the accompanying drawings. The present invention is not limited to these embodiments.

First Embodiment

Figure 1:
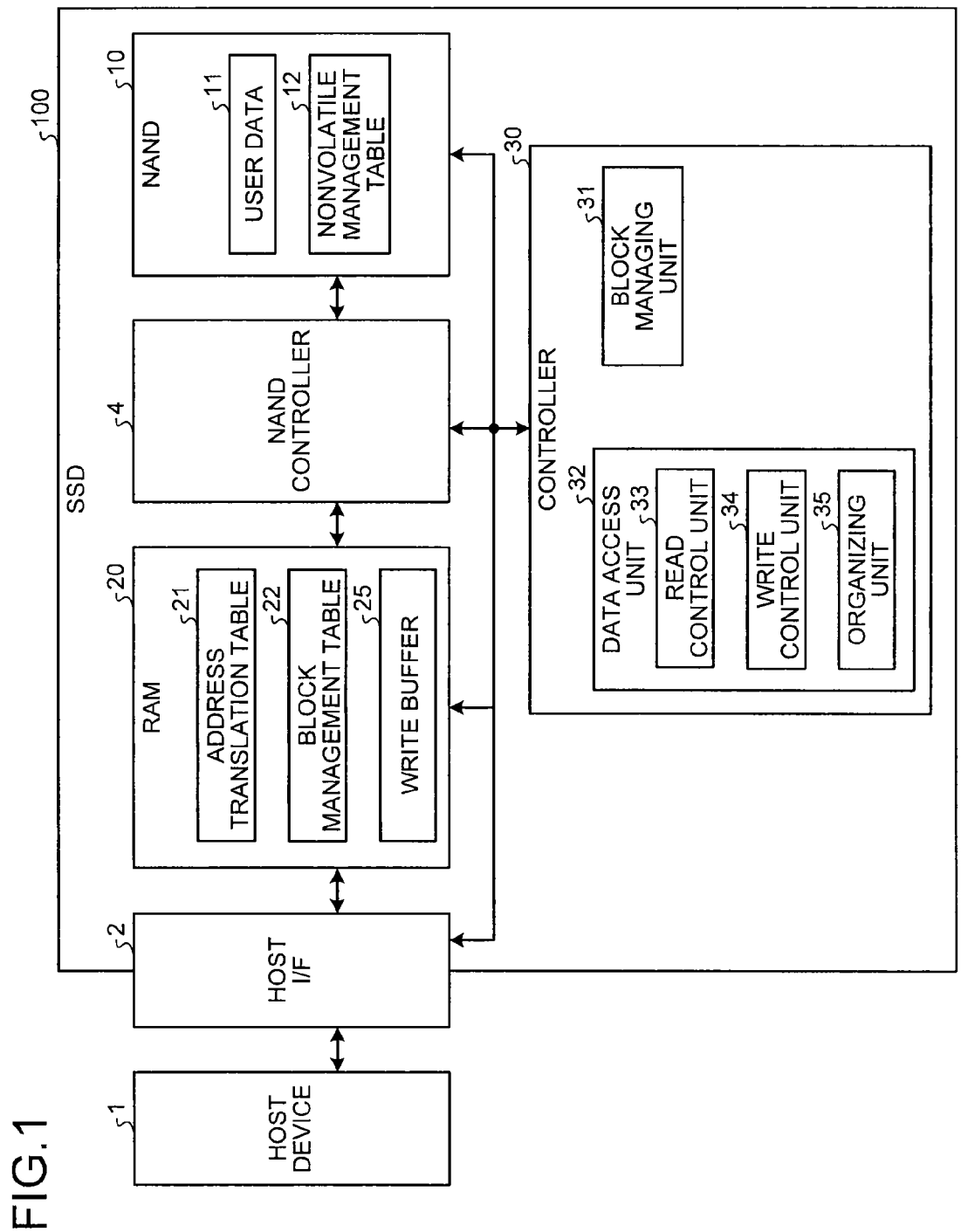
FIG. 1 is a block diagram illustrating an internal configuration example of an SSD.

FIG. 1 is a block diagram illustrating a configuration example of an SSD (Solid State Drive) 100 that is a memory system. The SSD 100 is connected to a host device (hereinafter, host) 1, such as a personal computer or a CPU, via a host interface 2, such as an ATA interface (ATA I/F), and functions as an external storage device of the host 1. Examples of the host 1 include a CPU of a personal computer and a CPU of an imaging device, such as a still camera and a video camera. The SSD 100 includes the host interface 2, a NAND-type flash memory (hereinafter, NAND) 10 that is a nonvolatile semiconductor memory, a RAM 20 that is a semiconductor memory capable of performing a high-speed access compared with the NAND 10 and performing a random access, a NAND controller (NANDC) 4, and a controller 30.

The NAND 10 stores therein user data 11 specified by the host 1 and management information managed in the RAM 20 for backup as a nonvolatile management table 12. The NAND 10 includes a memory cell array in which a plurality of memory cells is arrayed in a matrix manner, and each memory cell is capable of performing multi-value recording by using an upper page and a lower page. The NAND 10 includes a plurality of memory chips and each memory chip is configured by arraying a plurality of physical blocks such that one physical block is one unit for data erasing. In the NAND 10, writing and reading of data is performed in units of physical pages. A physical block consists of a plurality of physical pages.

The RAM 20 includes a storage area as a write buffer 25 for temporarily storing data when the data is written from the host 1 to the NAND 10, a storage area for storing and updating the management information, such as an address translation table 21 and a block management table 22, and a work area, for example, for temporarily storing data read from the NAND 10. The management information, such as the address translation table 21 and the block management table 22, is obtained by loading the nonvolatile management table 12 stored in the NAND 10 at the time of activation or the like.

The NAND controller 4 includes a NAND I/F that performs interface processing with the NAND 10, an error correction circuit, a DMA controller, and the like, and writes data temporarily stored in the RAM 20 to the NAND 10 and reads and transfers data stored in the NAND 10 to the RAM 20.

When the host 1 performs reading or writing on the SSD 100, the host 1 inputs an LBA (Logical Block Addressing) as a logical address to the SSD 100 via the host interface 2. An LBA is a logical address in which serial numbers starting from zero are attached to sectors (size: for example, 512 B). In the present embodiment, as a unit for managing data in the write buffer 25 and the NAND 10, a management unit called cluster, which is larger than the sector size and smaller than the physical block size, is defined. In this embodiment, one type of management unit called cluster is used, however, it is possible to add another management unit that is larger than the cluster size and is equal to or smaller than the block size and use two types of management unit. In this embodiment, the cluster size is the same as the page size for simplification.

The controller 30 includes a block managing unit 31 and a data access unit 32. The data access unit 32 includes a read control unit 33, a write control unit 34, and an organizing unit 35.

The block managing unit 31 manages the usage state of a block (whether a block is an active block in use or an unused free block) and identifies and manages a bad block that cannot be used as a storage area due to a large number of errors or the like. The block managing unit 31 notifies the data access unit 32 of a free block or an active block to be used. Moreover, the block managing unit 31 controls the gear ratio (to be described later) indicating the operating ratio of writing from the host 1 to compaction and notifies the data access unit 32 of this gear ratio.

The data access unit 32 performs read/write control of data specified from the host 1, organizing (compaction) of the NAND 10, and the like. The data access unit 32 performs write control of data specified from the host 1 by using a free block notified from the block managing unit 31 that is a block supplying source and performs the compaction by using an active block (compaction source block) and a free block (compaction destination block) notified from the block managing unit 31. Furthermore, the data access unit 32 implements 1:N compaction (to be described later) by performing writing from the host 1 and the compaction according to the gear ratio notified from the block managing unit 31.

When a read command and an LBA as a read address are input from the host 1, the read control unit 33 reads data corresponding to the LBA from the NAND 10 by referring to the forward lookup address translation table 21 and transmits the read data to the host 1.

When a write command, an LBA as a write address, and write data are input, the write control unit 34 writes data specified by the LBA to the write buffer 25. When there is no free space in the write buffer 25, data is flushed from the write buffer 25 and the flushed data is written in the NAND 10 by referring to the block management table 22 and the like. In response to this writing, the address translation table 21, the block management table 22, and the like are updated.

The organizing unit 35 performs the data organizing (compaction) in the NAND 10. The NAND 10 is a memory device that performs erasing in units of blocks and performs additional writing in units of pages. Therefore, in the NAND 10, overwriting cannot be performed and writing is always performed on an unwritten page area on which erasing is performed. When writing is repeated, the number of unused free blocks gradually decreases and free blocks that can be newly used are exhausted at a certain point. Moreover, a block in which valid data and invalid data are mixed and a block that includes only invalid data are generated by repeating writing. Thus, the compaction of collecting valid data from a plurality of blocks and moving the data to a new free block is performed, whereby a compaction source block becomes an invalid data area, therefore, the compaction source block can be used as a free block. A free block can be generated again by performing the compaction processing, therefore, new data can be written in the NAND 10.

As shown in FIG. 2, the address translation table 21 managed in the RAM 20 registers therein a correspondence between a cluster address of an LBA, a storage location (physical address: for example, block number+intra-block storage location) in the NAND 10 in which cluster data is stored, and a data presence/absence flag indicating whether data is present in the cluster. A cluster address is obtained by dividing an LBA by the cluster size. The address translation table 21 can search for a memory device location at which data corresponding to a logical address is present from the logical address and functions as a forward lookup table. This forward lookup address translation table 21 is used for read processing and the like. Moreover, when the relationship between a cluster address and a storage location in the NAND changes as a result of writing of data to the NAND 10, the address translation table 21 is updated.

As shown in FIG. 3, the block management table 22 managed in the RAM 20 registers therein block used/unused information indicating whether each block is an active block or a free block, a bad block flag identifying a bad block that cannot be used as a storage area due to a large number of errors or the like, and the like for each block number. A free block used when writing is performed on the NAND 10 is selected by using the block management table 22. Moreover, a free block (compaction destination block) used when the compaction is performed is selected by using the block management table 22.

Figure 4:
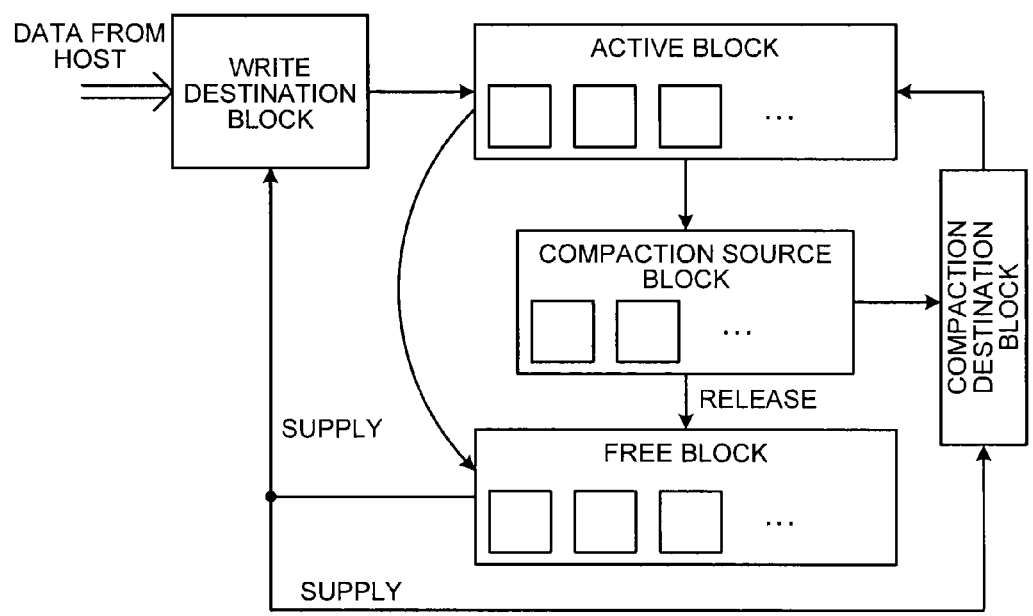
FIG. 4 is a diagram conceptually illustrating block management.

FIG. 4 is a diagram conceptually illustrating block management in the SSD 100. As described above, blocks are classified into an active block and a free block. For example, when data in the same LBA is overwritten, the following operation is performed. Assume that valid data of the block size is stored in a logical address A1 and a block B1 is used as a storage area. When a command to overwrite update data of the block size in the logical address A1 is received from the host 1, one free block FB (referred to as a block B2) is reserved and the data received from the host 1 is written in the free block. Thereafter, the logical address A1 is associated with the block B2. Consequently, the block B2 becomes an active block and the data stored in the block B1 becomes invalid, therefore, the block B1 becomes a free block.

In this manner, in the SSD 100, even for the data in the same logical address A1, a block actually used as a recording area changes every time writing is performed. When update data of the block size is written, a write destination block always changes, however, when update data of less than the block size is written, the update data is written in the same block in some cases. For example, when page data less than the block size is updated, old page data in the same logical address in the block is invalidated and the latest page data, which is newly written, is managed as a valid page. When all the data in the block is invalidated, the block is released as a free block.

In FIG. 4, data from the host 1 is written in a write destination block (free block). The block in which the data from the host 1 is written becomes an active block. According to the progress of rewriting of the NAND 10, an active block is released as a free block or released as a free block after becoming a write source block in the compaction. The free block is thereafter used as a write destination block for writing user data from the host 1 or a compaction destination block for writing data in the compaction.

Figure 5:
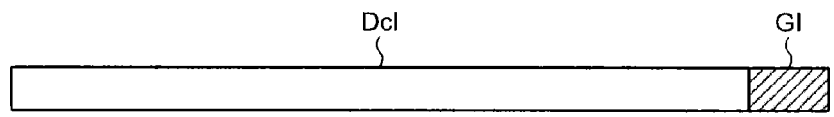
FIG. 5 is a diagram illustrating reverse lookup information added to data.

In the address translation table 21, a forward lookup is performed in which a storage location of data corresponding to an LBA in the NAND 10 is looked up on the basis of the LBA that is a logical address, and this address translation table 21 is used for read processing and the like. On the other hand, the processing to look up an LBA that is a logical address from a storage location of data in the NAND 10 is a reverse lookup, and this reverse lookup is mainly used when the compaction is performed. Although a reverse lookup address translation table may be prepared, a reverse lookup address translation table uses many storage areas in the NAND 10 and the RAM 20, therefore, in this embodiment, as shown in FIG. 5, reverse lookup information GI on cluster data Dcl is added to the cluster data Dcl and the cluster data Dcl to which the reverse lookup information GI is added is stored in the NAND 10.

The reverse lookup information GI includes a logical address (LBA) of the cluster data Dcl to which the reverse lookup information is added. The reverse lookup information GI may include a valid flag indicating whether the cluster data Dcl is valid or invalid in addition to an LBA, however, in this case, a valid flag is frequently updated in the NAND 10, therefore, addition of a valid flag is unrealistic. Thus, in this embodiment, an explanation is given of a valid/invalid determination of the cluster data Dcl in the case where the reverse lookup information GI includes only an LBA and does not include a valid flag.

Assume that cluster data G0 having a logical address LBA=A0 is written in a position (page) P0 in the NAND 10. The reverse lookup information GI added to the cluster data G0 has the logical address A0. Next, when LBA=A0 is updated by different data G1, in the case of the NAND 10, the data G1 cannot be overwritten in a written physical position, therefore, this data G1 is written in a physically different position (page) P1. The reverse lookup information GI added to the cluster data G1 also has the logical address A0. At this stage, the data G1 becomes the latest data in the logical address A0, therefore, the data G0 becomes invalid data and the data G1 becomes valid data. However, in this case, because the reverse lookup information GI is set not to have a valid flag, when only the reverse lookup information (LBA=A0) added to the data G0 and the reverse lookup information (LBA-A0) added to the data G1 are checked, each of them only has information indicating that the data is data in the logical address A0 and it is impossible to identify that which of them is valid.

Thus, the valid/invalid determination is performed in which the forward lookup address translation table 21 is compared with the reverse lookup information GI and it is determined that cluster data pointing to each other is valid data and cluster data pointing to only one of them is invalid data. Specifically, in the case of the compaction, when cluster data in a block is moved to a different block, invalid data does not need to be moved and only valid data is moved, therefore, it is determined whether the cluster data is valid by the valid/invalid determination. It is sequentially determined whether each cluster data included in each block as a target for the compaction is invalid or valid, therefore, first, the reverse lookup information GI added to cluster data as a target for the determination is read, an entry in the address translation table 21 that matches a logical address (LBA) to which the reverse lookup information GI points is retrieved, and it is determined whether the forward lookup information in this entry points to a storage location of the cluster data as a target for the determination. When the forward lookup information points to the storage location of the cluster data, it is determined that the cluster data as a target for the determination is valid. However, when the forward lookup information points to a different storage location, it is determined that the cluster data as a target for the determination is invalid. Such valid/invalid determination processing is performed repeatedly on each cluster data in a block as a target for the compaction, thereby collecting the necessary number of valid cluster data.

Figure 6:
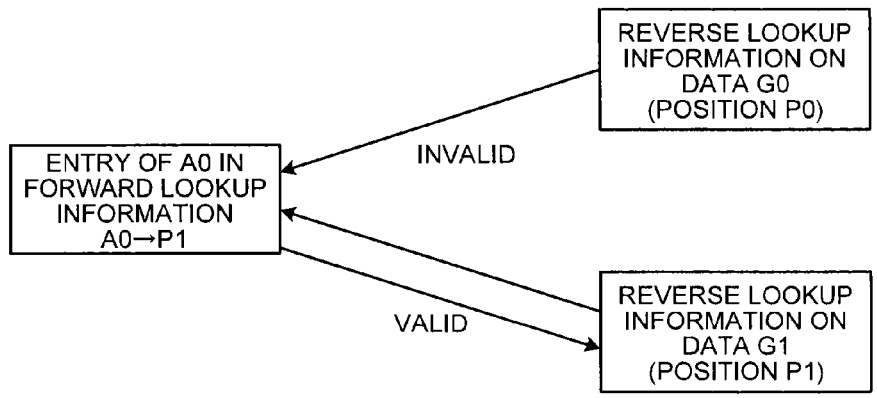
FIG. 6 is a diagram conceptually illustrating data valid/invalid determination processing.

FIG. 6 illustrates the valid/invalid determination relating to the data G0 and the data G1 described above. Because the reverse lookup information GI added to the cluster data G0 stored in the position P0 is LBA=A0, the forward lookup information included in an entry of LBA=A0 in the address translation table 21 is obtained. This forward lookup information indicates that data in the logical address LBA=A0 is present at the position P1, therefore, the comparison result of the reverse lookup information and the forward lookup information is a mismatch and this cluster data G0 is determined invalid. Because the reverse lookup information GI added to the cluster data G1 stored in the position P1 is LBA=A0, in a similar manner, the forward lookup information included in an entry of LBA=A0 in the address translation table 21 is obtained. This forward lookup information indicates that data in the logical address LBA=A0 is present at the position P1, therefore, the comparison result of the reverse lookup information and the forward lookup information is a match and this cluster data G0 is determined valid.

In this manner, the reverse lookup information GI on cluster data as a target for reading needs to be read from the NAND 10 for performing the valid/invalid determination. Moreover, it is needed to compare the reverse lookup information GI with the forward lookup address translation table 21, therefore, a predetermined processing time is required. In other words, even if actual data movement (reading and writing) in the compaction processing of moving cluster data to a different block does not occur, a predetermined processing time is required for repeatedly performing the valid/invalid determination. When cluster data as a target for the determination is valid data, writing to a compaction destination block occurs, however, when cluster data as a target for the determination is invalid data, writing to a compaction destination block does not occur.

When there are many free blocks, the compaction does not need to be performed, however, when the number of free blocks decreases after a certain amount of writing is performed, the compaction needs to be performed. If a free block is generated by the compaction after the number of free blocks decreases and there are few free blocks, the response to a write command from the host 1 degrades. This is because, first, the processing time is required for generating a free block by the compaction and writing of data from the host 1 can be performed when a free block is prepared after the lapse of the processing time.

Thus, in order to prevent extreme reduction of the response speed to a write command, the present embodiment applies a method of causing to perform writing of data from the host 1 and writing due to the compaction at a constant proportion (ratio). The method of performing writing due to the compaction on N blocks (N pages) for writing of data from the host 1 for one block (one page) is defined as the compaction with the gear ratio of 1:N.

A write destination block of host data is referred to as HostDst, a compaction destination block is referred to as CmpDst, and a compaction source block is referred to as CmpSrc. N pages of data are written to the CmpDst for one page of data writing to the HostDst, thereby performing the 1:N compaction. The term for writing one block of data to the HostDst is referred to as a compaction term. In the present embodiment, because the page size is equal to the cluster size, N pieces of cluster data are written to the CmpDst for one piece of cluster data writing to the HostDst, thereby performing the 1:N compaction.

When there is a sufficient number of free blocks equal to or larger than a fixed number among all the blocks, the compaction does not need to be performed and only writing to the HostDst is performed. This is referred to as 1:0 compaction. Normally, the compaction is started from the 1:0 compaction and 1:1 or 1:2 compaction is performed after the number of free blocks decreases and the number of active blocks increases. If the compaction needs to be performed more frequently, for example, in a case where the number of free blocks is small, N in 1:N is increased. However, in the 1:N compaction in which N is large, when the next free block cannot be reserved in the compaction even if writing of host data to all the pages in the block HostDst is finished, that is, when sufficient free blocks cannot be generated in the compaction processing and reserving the write destination block HostDst for host data is forced to wait, the gear ratio becomes 0:1, therefore, writing from the host 1 is temporarily suspended and only the compaction processing is performed. In this manner, writing of data from the host 1 and writing due to the compaction can be performed while balancing them by changing the gear ratio. For example, the gear ratio is determined from the ratio of free blocks to active blocks.

The gear ratio is controlled by the block managing unit 31 that is a block supplying source. The data access unit 32 that is a block request source only performs a write operation (the write control unit 34) of data from the host 1 and the compaction operation (the organizing unit 35) according to the gear ratio provided from the block managing unit 31 and does not have responsibility for the compaction result (such as the number of free blocks that can be generated) of the organizing unit 35. Consequently, the data access unit 32 can be implemented with hardware or software that performs only simple operation processing.

Figure 7:
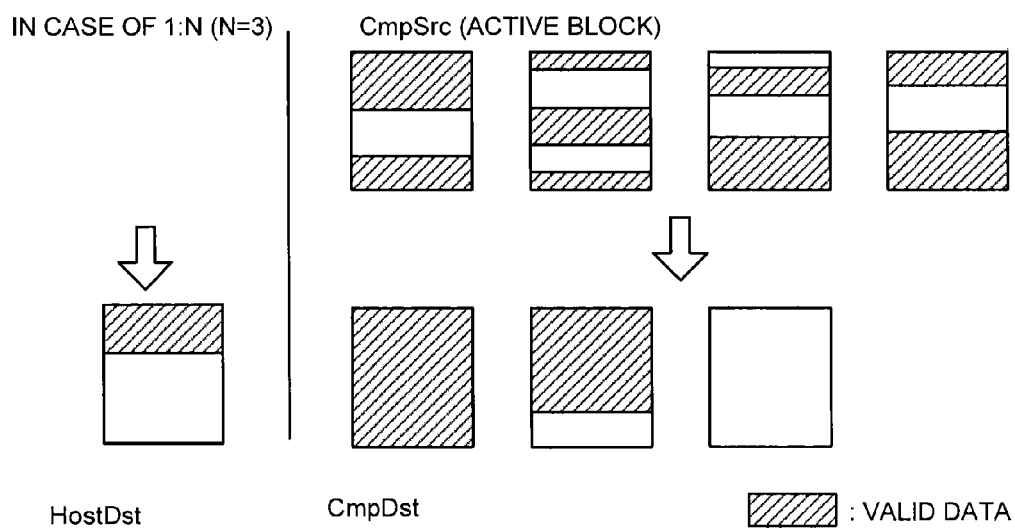
FIG. 7 is a diagram conceptually illustrating 1:N compaction.

FIG. 7 illustrates the compaction with the gear ratio of 1:3. In FIG. 7, the compaction of generating one free block is performed by moving valid cluster data in the compaction source blocks CmpSrc that are four active blocks to the compaction destination blocks CmpDst that are three free blocks. In this case, because the 1:3 compaction is performed, writing due to the compaction is performed on the three blocks CmpDst for writing of data from the host 1 to one block HostDst.

Figure 8:
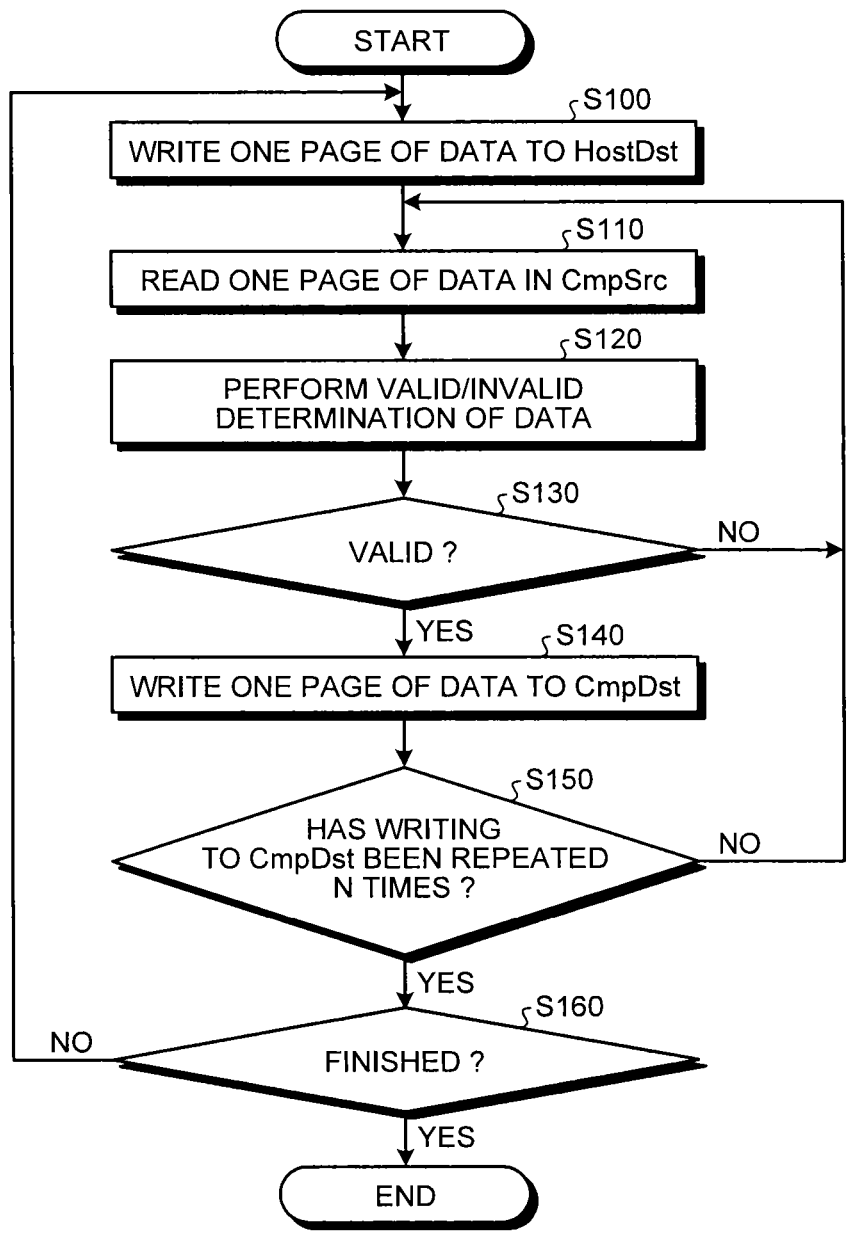
FIG. 8 is a flowchart illustrating an operation procedure example of the 1:N compaction in a first comparison example.

FIG. 8 illustrates the 1:N compaction procedure by a first comparison example. First, one page of write data from the host 1 is written in the block HostDst (Step S100). Next, one page of data in the compaction source block CmpSrc is read (Step S110) and the above-described valid/invalid determination of data is performed (Step S120). When the data is invalid (No in Step S130), data on the next page in the compaction source block CmpSrc is read (Step S110) and thereafter, a similar valid/invalid determination is performed (Step S120). In this manner, the valid/invalid determination is performed until valid data is found. When valid data is found (Yes in Step S130), this valid data is written in the compaction destination block CmpDst (Step S140).

Next, it is determined whether writing to the compaction destination block CmpDst has been repeated N times (Step S150). When writing to the compaction destination block CmpDst has not been repeated N times, the procedure moves to Step S110. In this manner, the valid/invalid determination of data and data writing to the compaction destination block CmpDst are repeated until writing to the compaction destination block CmpDst is performed N times. Then, when writing to the compaction destination block CmpDst is performed N times, it is determined whether the 1:N compaction procedure relating to the current host data is finished (Step S160). When the 1:N compaction procedure is not finished, the procedure moves to Step S100 and then, write data from the host 1 is written in the block HostDst for the next page. Such processing is repeated. In Step S160, when it is determined that the 1:N compaction procedure relating to the current host data is finished, the 1:N compaction procedure relating to the current host data is finished.

In this manner, basically, one page writing to the block HostDst and writing of N pages of valid data to the compaction destination block CmpDst are alternately performed.

Figure 9:
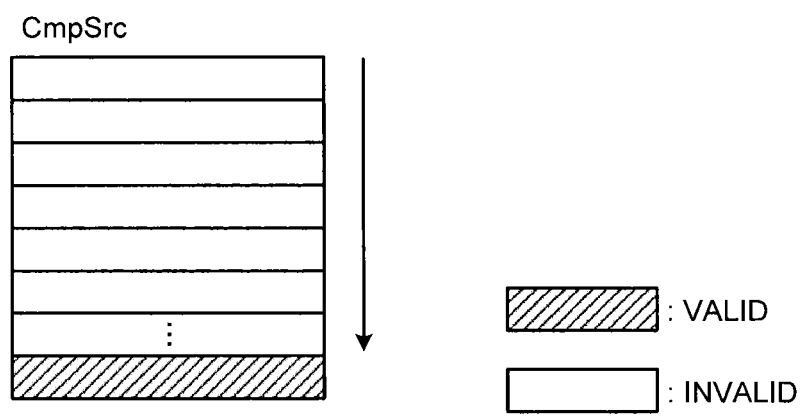
FIG. 9 is a diagram illustrating an example of a compaction source block.

However, in the compaction processing, the state of the progress of writing changes depending on not only the state of the compaction destination block CmpDst (such as the number of free blocks) described above but also the state of the compaction source block CmpSrc. In the first comparison example shown in FIG. 8, when the compaction source block CmpSrc is filled with valid data, a valid determination is made frequently in the valid/invalid determination in Steps S120 and S130, therefore, writing to the compaction destination block CmpDst (Step S140) is performed frequently. However, in the first comparison example, as shown in FIG. 9, when the compaction source block CmpSrc is filled with invalid data and valid data is present only near the last page, the valid/invalid determination processing from Steps S110 to S130 continues in a loop until valid data is found.

The compaction processing is performed for reserving a free block by organizing valid data and creating an invalid data area by filling a free block with valid data. Therefore, moving data from a block filled with valid data has no effect of reserving an area. Rather, as described above, it is more efficient that the compaction source block CmpSrc includes many invalid data areas for reserving many free blocks.

In the first comparison example, if writing to the compaction destination block CmpDst in Step S140 does not progress, writing of host data to the block HostDst also does not progress, therefore, the response to a write command is delayed from the standpoint of the host 1. In this manner, although it is more efficient that the compaction source block CmpSrc includes many invalid data for generating a free block, the method of the first comparison example has a problem in that when many invalid data is present in the compaction source block CmpSrc, the response speed to a write command decreases.

Thus, in the present embodiment, in the valid/invalid determination processing, if an invalid determination is made continuously a predetermined number K of times or more, the processing is caused to exit the loop (Steps S110 to S130) of the valid/invalid determination processing, thereby preventing extreme reduction of the response speed to a write command.

Figure 10:
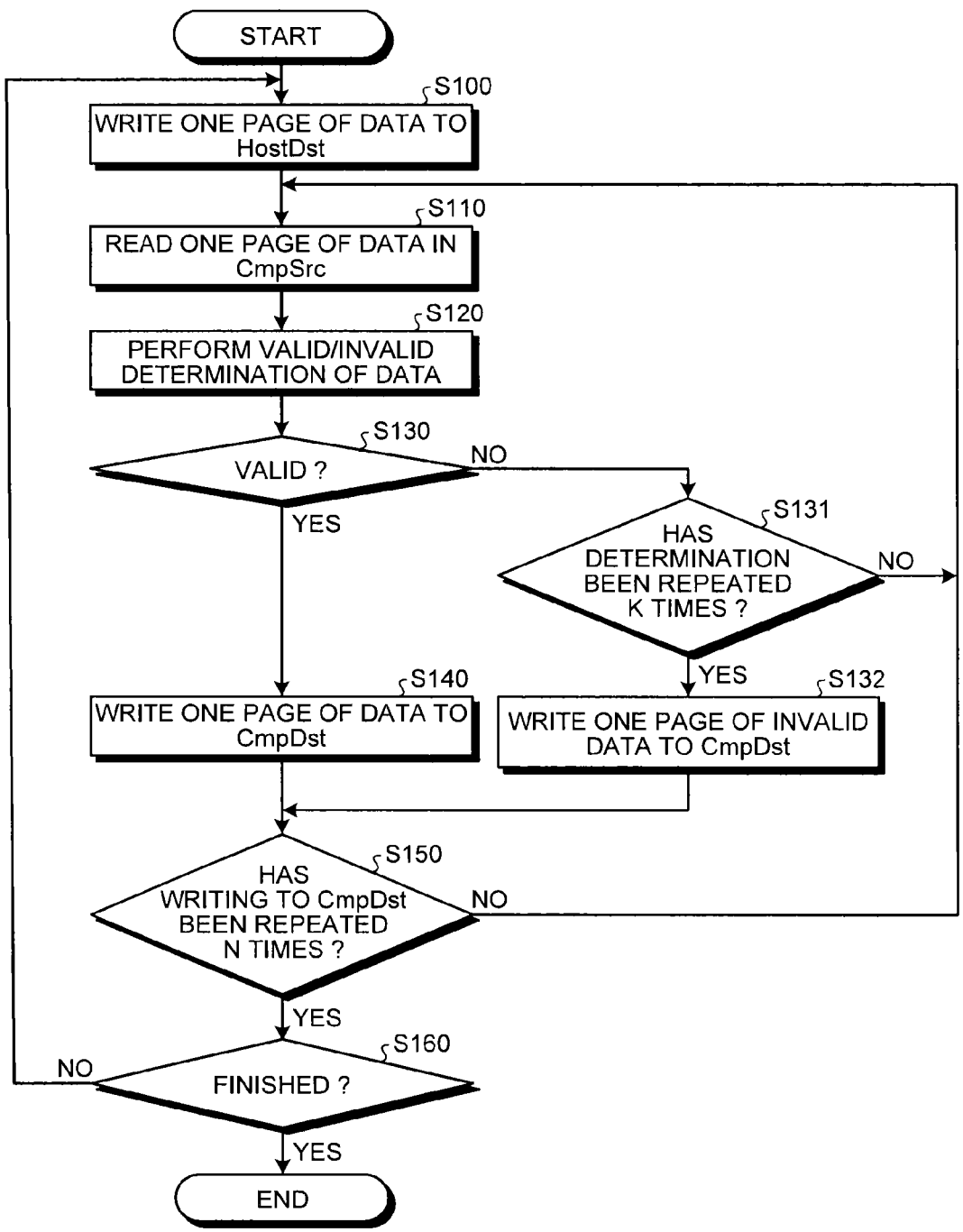
FIG. 10 is a flowchart illustrating an operation procedure example of the 1:N compaction in a first embodiment.

FIG. 10 illustrates the 1:N compaction procedure in the present embodiment. In FIG. 10, the procedures in Steps S131 and S132 are added to the flowchart in FIG. 8. The block managing unit 31 determines the gear ratio N, for example, from the ratio of the number of current free blocks to the number of current active blocks and provides this gear ratio N to the data access unit 32. Moreover, the block managing unit 31 determines the upper limit number K of invalid determinations to be described later and provide this upper limit number K to the data access unit 32. The data access unit 32 notifies the write control unit 34 and the organizing unit 35 under the management thereof of the provided gear ratio N. Moreover, the data access unit 32 notifies the organizing unit 35 of the provided upper limit number K. The write control unit 34 and the organizing unit 35 perform the above-described 1:N compaction according to the provided gear ratio N while alternately switching a write permission to the NAND 10.

First, the write control unit 34 writes one page (=one cluster) of write data from the host 1 to the block HostDst (Step S100). When write processing for one page is finished, the write control unit 34 gives a write permission to the NAND 10 to the organizing unit 35.

The organizing unit 35 reads one page of data in the compaction source block CmpSrc that is one of the organizing target blocks (Step S110) and performs the valid/invalid determination on the one page of data (Step S120). When this data is valid (Yes in Step S130), the organizing unit 35 writes this valid data to the compaction destination block CmpDst (Step S140). However, when the organizing unit 35 determines that this data is invalid (No in Step S130), the organizing unit 35 determines whether the invalid determination in Step S130 has been repeated the predetermined number of times K or more (Step S131). When the determination in Step S131 is No, the organizing unit 35 moves the procedure to Step S110 and reads data on the next page in the compaction source block CmpSrc. Thereafter, the organizing unit 35 performs a similar valid/invalid determination (Step S120). In this manner, the organizing unit 35 performs the valid/invalid determination until valid data is found by repeating the loop of Steps S130, S131, S110, and S120 at most K−1 times. When valid data is found, this one page of valid data is written in the compaction destination block CmpDst by the organizing unit 35 (Step S140).

Figure 11:
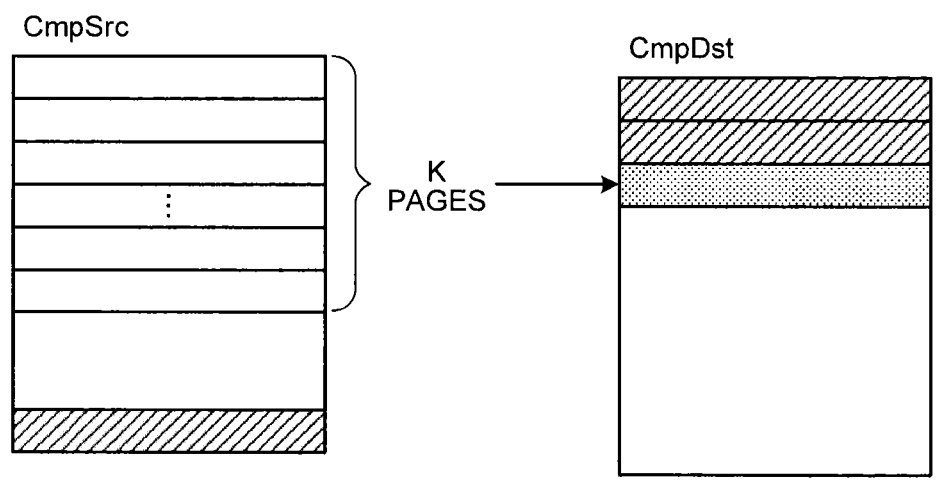
FIG. 11 is a diagram conceptually illustrating writing of dummy data in the first embodiment.

However, when the loop of Steps S130, S131, S110, and S120 is repeated, if the organizing unit 35 determines that the invalid determination in Step S130 has been repeated the predetermined number of times K or more in Step S131, the organizing unit 35 writes one page of invalid dummy data to the compaction destination block CmpDst as shown in FIG. 11 (Step S132). Invalid dummy data may be any data as long as the invalid dummy data includes an invalid flag for identifying that the data is invalid. The determination in Step S131 can be implemented by a counter that is cleared when the invalid determination result is obtained continuously for K pages or when even one page of valid data is written in the compaction destination block CmpDst.

Next, the organizing unit 35 determines whether one page writing to the compaction destination block CmpDst is repeated N times (Step S150). When the number of times writing is performed on the compaction destination block CmpDst is counted, writing of invalid dummy data in Step S132 is also counted as one writing. When writing to the compaction destination block CmpDst has not been repeated N times, the procedure moves to Step S110. In this manner, the valid/invalid determination of data and writing of valid data or invalid dummy data to the compaction destination block CmpDst are repeated until writing to the compaction destination block CmpDst is performed N times.

Then, when writing to the compaction destination block CmpDst is performed N times, the organizing unit 35 determines whether the 1:N compaction procedure relating to the current host data is finished (Step S160). When it is not finished, the organizing unit 35 gives a write permission to the NAND 10 to the write control unit 34. As a result, the procedure moves to Step S100 and then, write data from the host 1 is written in the block HostDst for the next one page by the write control unit 34. Such processing is repeated. In Step S160, when it is determined that the 1:N compaction procedure relating to the current host data is finished, the 1:N compaction procedure relating to the current host data is finished.

In this manner, basically, one page writing to the block HostDst and writing of N pages of valid data or invalid dummy data to the compaction destination block CmpDst are alternately performed according to the gear ratio.

In the present embodiment, as shown in FIG. 11, when the invalid determination result is obtained continuously for K pages, invalid dummy data is written in the compaction destination block CmpDst, therefore, the gear ratio in the compaction term substantially changes, however, it is possible to maintain the progress ratio of writing to the block HostDst for writing host data to writing to a compaction destination block.

In the present embodiment, the write control unit 34 performs writing of data from the host 1 and the organizing unit 35 performs the overall compaction processing, however, it is desirable to divide the functions in such a way that the organizing unit 35 reads data from a compaction source block and performs the invalid determination processing on the read data and the write control unit 34 performs writing of data from the host 1 and writing of data to a compaction destination block. When the functions are divided in such a manner, in the present embodiment, the following advantages are obtained. In the present embodiment, when the invalid determination result is obtained continuously for K pages, the function of writing invalid dummy data to the compaction destination block CmpDst without skipping writing to the compaction destination block CmpDst is added to the first comparison example, and this function addition requires only a function addition to the organizing unit 35 but does not require a function change in the write control unit 34. In other words, when writing to the compaction destination block CmpDst is skipped, a function change in the write control unit 34 is needed, however, when invalid dummy data is written in the compaction destination block CmpDst, a function change in the write control unit 34 is not needed by passing invalid dummy data from the organizing unit 35 to the write control unit 34, therefore, the write control unit 34 can devote to write processing without knowing the data content.

Moreover, when the invalid determination result is obtained continuously for K pages, invalid dummy data is written, therefore, when data is read for performing the compaction again, the processing time for the valid/invalid determination is reduced.

In this manner, in the present embodiment, in the valid/invalid determination processing of data in a compaction source block, when the invalid determination result is obtained continuously for K pages, the current valid/invalid determination processing is caused to end and invalid dummy data is written in the compaction destination block CmpDst, therefore, the response speed to a write command can be prevented from extremely decreasing while maintaining the gear ratio. In other words, in the present embodiment, it is possible to set the upper limit of the response delay to a write command by setting the upper limit K, therefore, it is possible to prevent that the compaction continues operating endlessly in the case of falling into a situation where a free block cannot be generated even after the lapse of a long time.

In the present embodiment, when the invalid determination result is obtained continuously for K pages, invalid dummy data is written in the compaction destination block CmpDst, however, writing to the compaction destination block CmpDst may be simply skipped.

Moreover, in the SSD capable of recording in the multi-value recording (MLC: Multi-Level Cell) mode and the binary recording (SLC: Single-Level Cell) mode, high-speed writing can be performed in the SLC mode compared with the MLC mode, therefore, writing of data from the host may be performed in the SLC mode and writing to a compaction destination block may be performed in the MLC mode. In this method, first, the compaction is performed in which a block in the SLC mode is set as a compaction source block and writing in the MLC mode is performed on a compaction destination block. Then, when a sufficient number of free blocks cannot be reserved, next, the compaction is performed in which a block in the MLC mode is set as a compaction source block and writing in the MLC mode is performed on a compaction destination block.

Moreover, in the present embodiment, the reverse lookup information GI only includes a logical address (LBA) of data, however, the reverse lookup information GI may include a valid flag indicating whether data is valid or invalid. Moreover, in the present embodiment, the reverse lookup information GI is added to data, however, a table managing the reverse lookup information may be prepared and a reverse lookup may be performed by using this reverse lookup management table. Moreover, when the cluster size is defined smaller than the page size, the reverse lookup information on cluster data in a page may be collectively stored in a predetermined cluster in the page.

Moreover, in the flowchart shown in FIG. 10, data writing (S100, S132, and S140) and data reading (S110) in units of pages are performed for simplification, however, the unit for writing and reading is not limited to a page and may be a cluster (page size≠cluster size) or may be another unit.

Moreover, when the compaction with the gear ratio of 1:N is performed, if the processing time for the compaction is measured and the compaction processing time becomes equal to or more than a threshold Ta, the compaction processing may be forcibly interrupted and writing of data from the host 1 may be performed. With such a control also, the response speed to a write command can be prevented from extremely decreasing.

Second Embodiment

The valid/invalid determination processing described in the first embodiment will be explained in detail in the present embodiment. Prior to the explanation, a second comparison example will be explained for comparison with the present embodiment.

Figure 12:
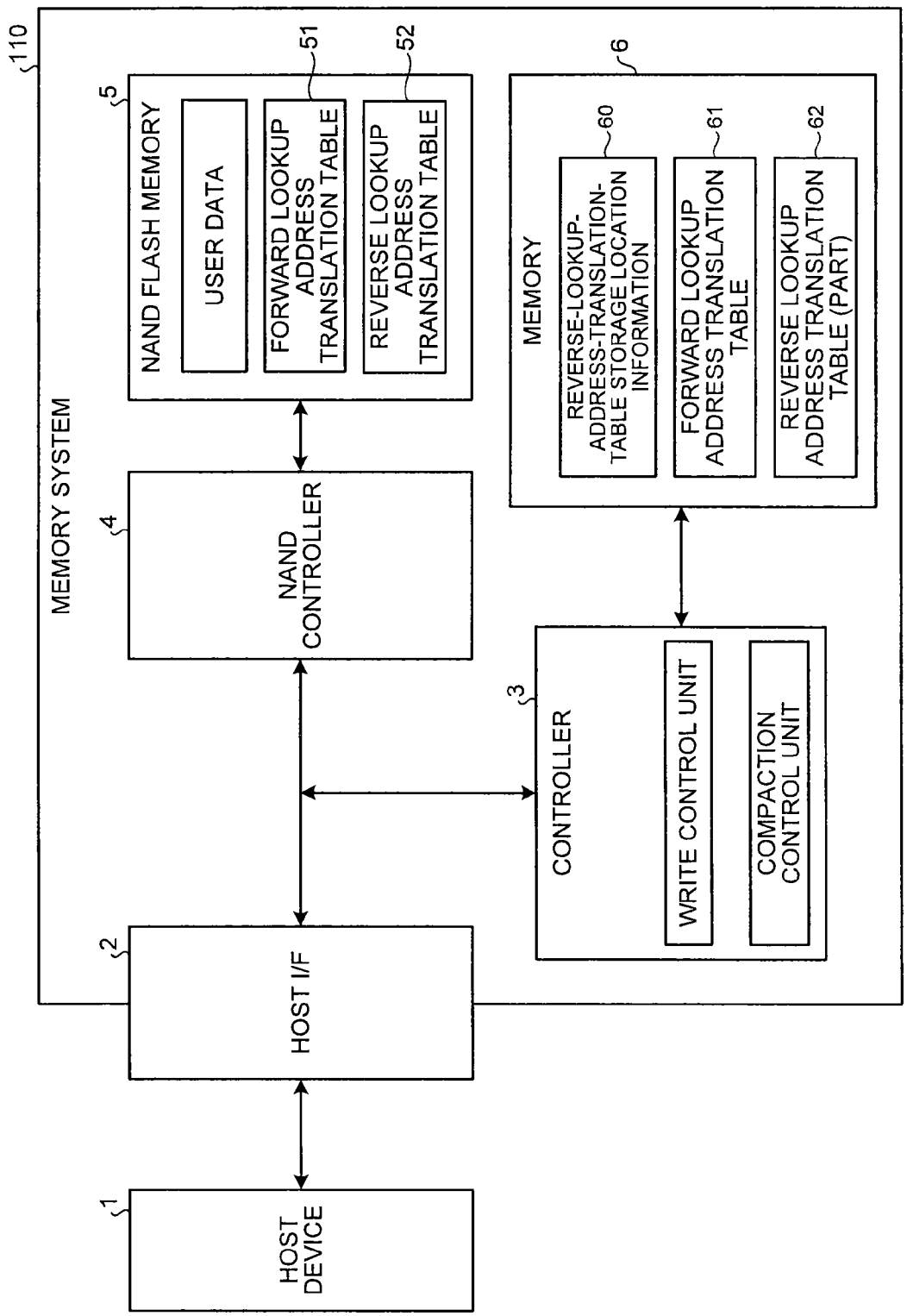
FIG. 12 is a diagram illustrating the configuration of a memory system in a second comparison example.

FIG. 12 illustrates the configuration of a memory system 110 in the second comparison example. The memory system 110 includes the host interface 2, a controller 3, the NAND controller 4, a NAND flash memory 5 (nonvolatile memory), and a memory 6 (volatile memory) composed of a RAM or the like. The memory system 110 is connected to the host device 1 via the host interface 2. In the compaction processing, it is needed to determine whether movement source data is valid data or invalid data. Valid data is data associated with a host address and invalid data is data that is not associated with a host address. In the second comparison example, a reverse lookup address translation table (translation table from NAND address (physical address) into host address: Reverse Lookup Table), which indicates a host address that data in a NAND block included in the NAND flash memory 5 belongs to or indicates that the data is invalid data, is used. A reverse lookup address translation table 52 is stored in the NAND flash memory 5, and, when the memory system 110 is operated, only part of the reverse lookup address translation table 52 is loaded into the memory 6 as a reverse lookup address translation table (part) 62 having the same content as the reverse lookup address translation table 52. Reverse-lookup-address-translation-table storage location information (table pointer) 60 is also loaded into the memory 6 and part of the reverse lookup address translation table 52 is loaded into the memory 6 when needed by using the reverse-lookup-address-translation-table storage location information 60 and is used as the reverse lookup address translation table (part) 62.

Figure 13:
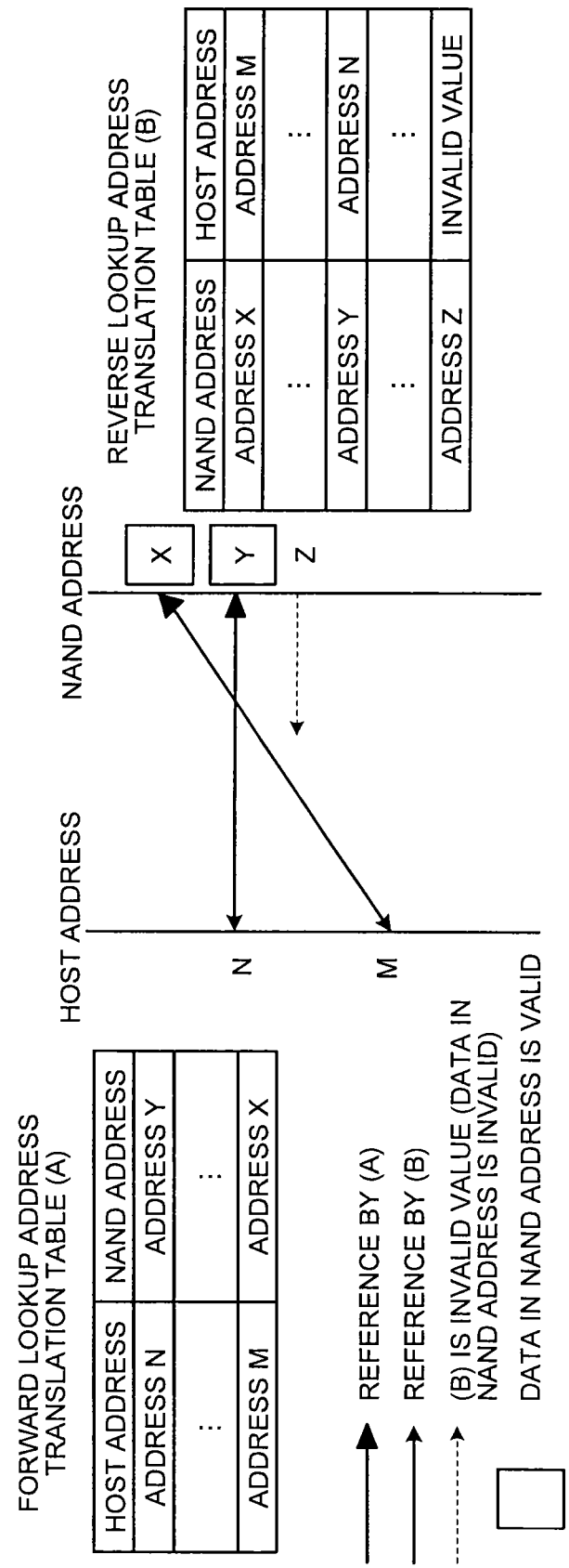
FIG. 13 is a diagram illustrating the configuration of a forward lookup address translation table and a reverse lookup address translation table in the second comparison example.

An example of the reverse lookup address translation table is illustrated as a reverse lookup address translation table (B) in FIG. 13. When user data recorded in a NAND address is valid data, a corresponding host address is present in the reverse lookup address translation table (B). For example, a host address M corresponds to a NAND address X and a host address N corresponds to a NAND address Y. When user data movement occurs due to new writing and the compaction, user data in a NAND address of a movement source becomes invalid, therefore, a value (invalid value) indicating invalidity is input to a host address corresponding to the NAND address. In the example of the reverse lookup address translation table (B) in FIG. 13, an invalid value is input to a host address corresponding to a NAND address Z.

When the compaction is performed, it is possible to determine whether data in a NAND block is valid data or invalid data by using this reverse lookup address translation table. For reading host data, a forward lookup address translation table (translation table from host address into NAND address: Lookup Table) (A), which refers to an address in a NAND block from a host address, is needed (FIG. 13). A forward lookup address translation table 51 is also stored in the NAND flash memory 5, and, when the memory system 110 is operated, a forward lookup address translation table 61 having the same content is loaded into the memory 6. The forward lookup address translation tables 61 and 51 need to be updated to point to a NAND address of a movement destination after overwriting of data to the same host address or the compaction processing.

In the second comparison example, a case where user data is overwritten to the host addresses N and M shown in FIG. 13 will be explained below with reference to the flowchart in FIG. 14 and FIG. 15.

Figure 14:
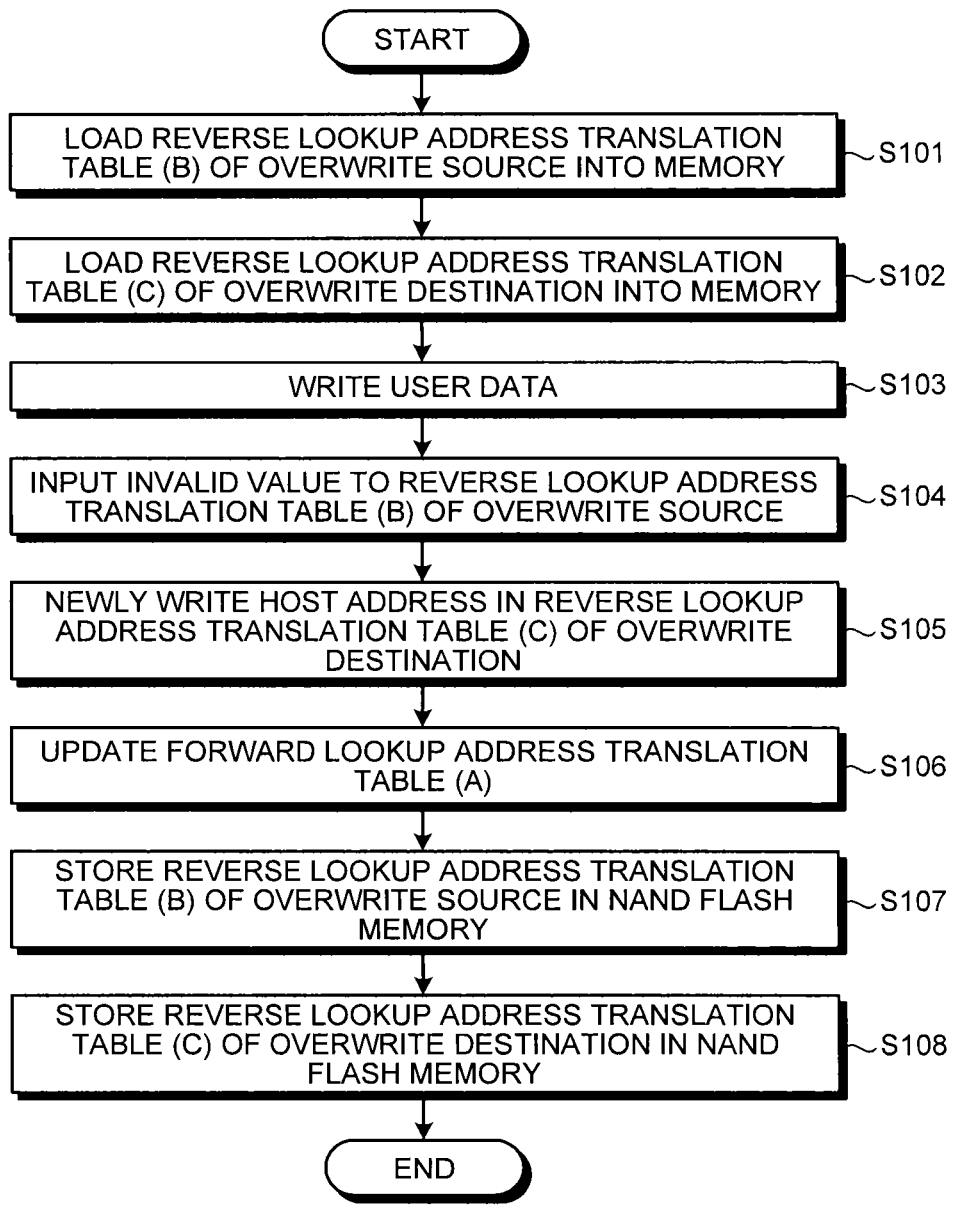
FIG. 14 is a flowchart in a case where user data is overwritten in the second comparison example.
Figure 15:
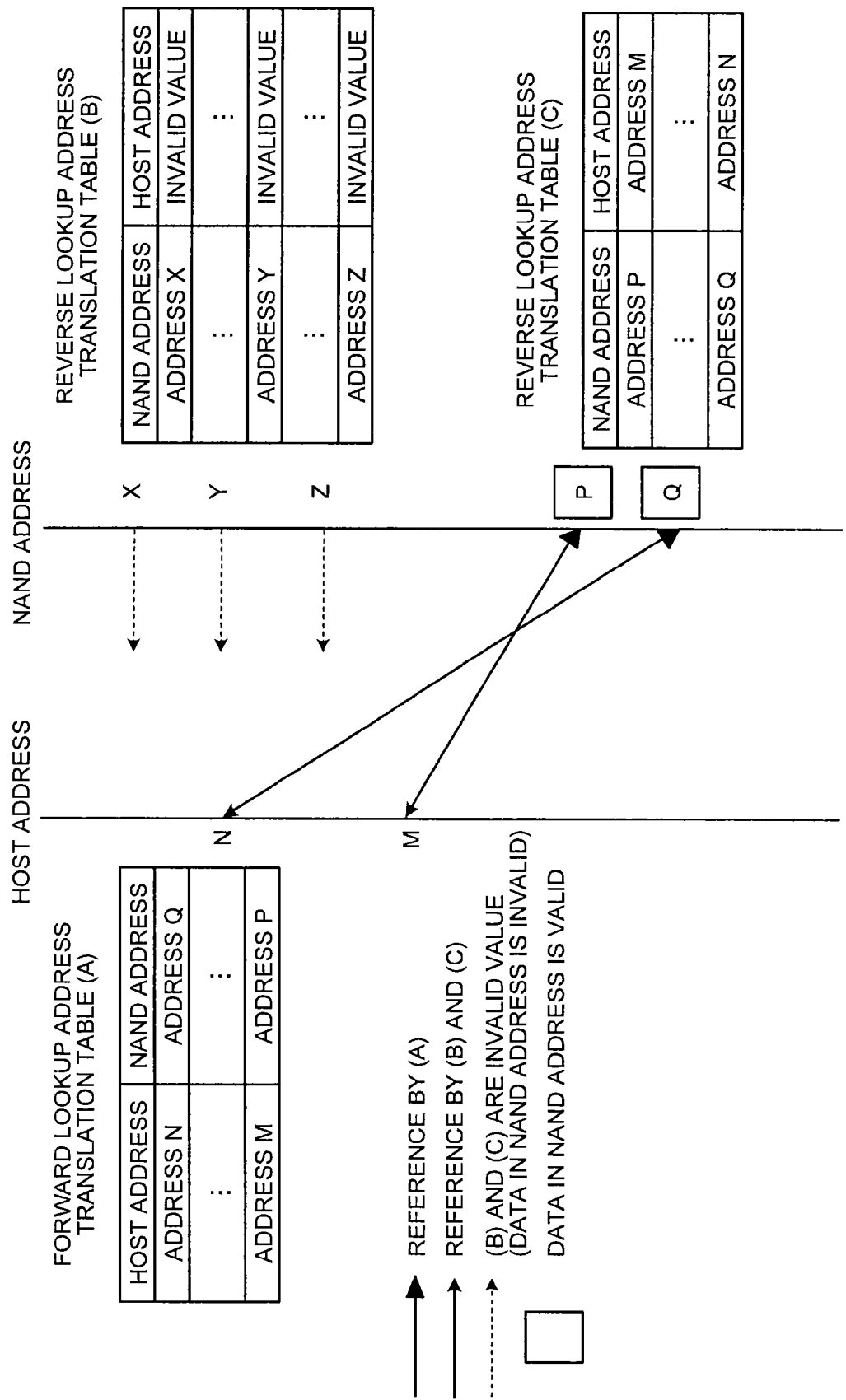
FIG. 15 is a diagram illustrating the configuration of a forward lookup address translation table and reverse lookup address translation tables in the second comparison example.

First, in Step S101 in FIG. 14, the reverse lookup address translation table (B) (FIG. 13) of an overwrite source is loaded into the memory 6 from the NAND flash memory 5. Next, in Step S102, a reverse lookup address translation table (C) of an overwrite destination is loaded into the memory 6 from the NAND flash memory 5. In this embodiment, when the reverse lookup address translation tables (B) and (C) are not used, they are made nonvolatile (state where they are stored in the NAND flash memory 5 and are not present in the memory 6). Moreover, assume that an invalid value is written in the host addresses corresponding to NAND addresses P and Q of the reverse lookup address translation table (C). In other words, the addresses P and Q do not have corresponding host addresses and are writable addresses. A case where new user data is overwritten in the host addresses N and M will be considered as an example of updating the forward and reverse lookup address translation tables. New user data to be written in the addresses N and M is written in the NAND addresses Q and P, respectively (Step S103).

Next, an invalid value is written in the host addresses corresponding to the NAND addresses X and Y in the reverse lookup address translation table (B) in FIG. 13 (Step S104). Consequently, the reverse lookup address translation table (B) becomes as shown in FIG. 15. Furthermore, as shown in FIG. 15, the addresses M and N are newly written in the host addresses corresponding to the NAND addresses P and Q in the reverse lookup address translation table (C) (Step S105). Then, as shown in FIG. 15, the forward lookup address translation table (A) is updated by writing the new NAND addresses Q and P in which user data is written in the NAND addresses corresponding to the host addresses M and N in the forward lookup address translation table (A) in FIG. 13 (Step S106). The forward lookup address translation table (A) may also be loaded into the memory 6 when needed. These forward and reverse lookup address translation tables are updated in the memory 6 and thereafter, the reverse lookup address translation table (B) is stored in the NAND flash memory 5 (Step S107) and the reverse lookup address translation table (C) is stored in the NAND flash memory 5 (Step S108). When the reverse lookup address translation table (C) is continuously used, the information thereon may be left in the memory 6. In the case of the compaction, data written in the address X is copied to the NAND address P and data written in the address Y is copied to the NAND address Q, which is different from above, however, an invalid value needs to be written in the host addresses corresponding to the addresses X and Y in a similar manner to the above.

As above, in the second comparison example, whether data in the NAND flash memory 5 is valid data or invalid data is determined on the basis of the reverse lookup address translation table. In this case, when data movement due to overwriting of data or the compaction occurs and user data needs to be invalidated, it is needed to input a value (invalid value) indicating that a host address is invalid to the host address corresponding to a NAND address of original data in the reverse lookup address translation table. The write amplification factor decreases due to this processing. The write amplification factor indicates a ratio of the amount of data actually written to the NAND device to the amount of data written to the host device 1. Moreover, conventionally, the forward and reverse lookup address translation tables are all loaded into the memory 6, however, there is a problem in that a large memory size is needed. For solving this problem, for example, in this second comparison example, the reverse lookup address translation table is made nonvolatile in the NAND flash memory 5. In other words, when the reverse lookup address translation table is needed, such as in the case of the compaction processing, a required part of the reverse lookup address translation table 52 that is made nonvolatile in the NAND flash memory 5 is loaded into the memory 6 and is used as the reverse lookup address translation table (part) 62. Furthermore, in order to recognize the position at which the necessary part of the reverse lookup address translation table is stored, storage location information (table pointer) on the reverse lookup address translation table is stored in the memory 6. In this case also, for updating the reverse lookup address translation table that is made nonvolatile, the reverse lookup address translation table that is made nonvolatile needs to be read, updated, and made nonvolatile again (storing in the NAND flash memory 5), therefore, there is a problem in that the overhead becomes large. Moreover, there is a problem in that the reverse lookup address translation table is made nonvolatile frequently and therefore the write amplification factor to the NAND flash memory 5 decreases.

Figure 16:
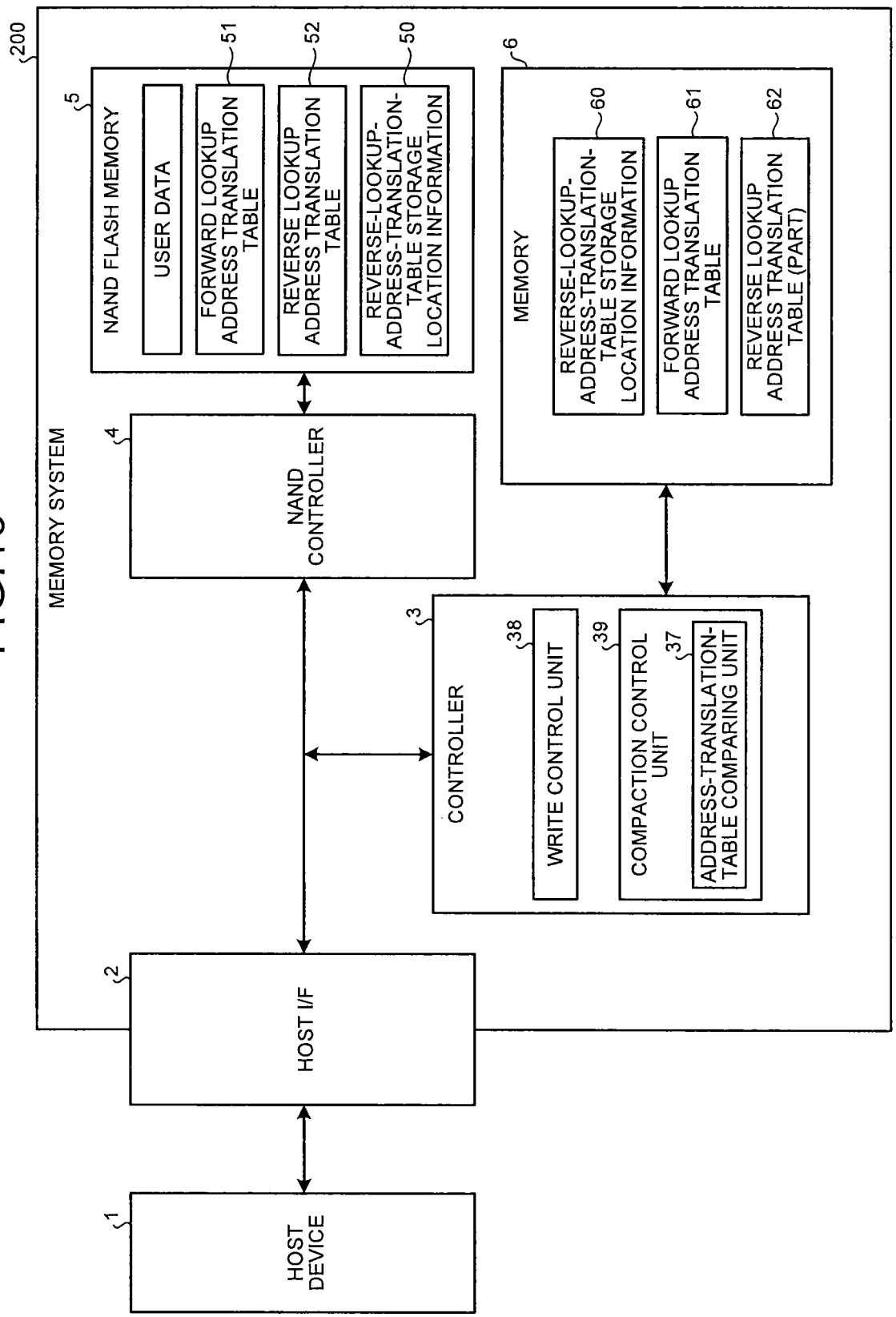
FIG. 16 is a diagram illustrating the configuration of a memory system in the second embodiment.

FIG. 16 illustrates the configuration of a memory system 200 according to the second embodiment. The memory system 200 includes the host interface 2, the controller 3, the NAND controller 4, the NAND flash memory 5 (nonvolatile memory), and the memory 6 (volatile memory) composed of a RAM or the like. The memory system 200 is connected to the host device 1 via the host interface 2. The controller 3 includes a compaction control unit 39 that controls the compaction processing in addition to a write control unit 38, and the compaction control unit 39 includes an address-translation-table comparing unit 37. The NAND flash memory 5 (nonvolatile memory) stores the forward lookup address translation table 51 (translation table from host address into NAND address (physical address): Lookup Table), the reverse lookup address translation table 52 (translation table from NAND address into host address: Reverse Lookup Table), and storage location information (table pointer) 50 on the reverse lookup address translation table 52. The address-translation-table comparing unit 37 determines whether user data is valid data or invalid data in the compaction processing by using both the reverse lookup address translation table 62 and the forward lookup address translation table 61 in the memory 6. Reverse-lookup-address-translation-table storage location information (table pointer) 60 is also loaded into the memory 6 and part of the reverse lookup address translation table 52 is loaded into the memory 6 when needed by using the reverse-lookup-address-translation-table storage location information 60 as described later and is used as the reverse lookup address translation table (part) 62.

Figure 17:
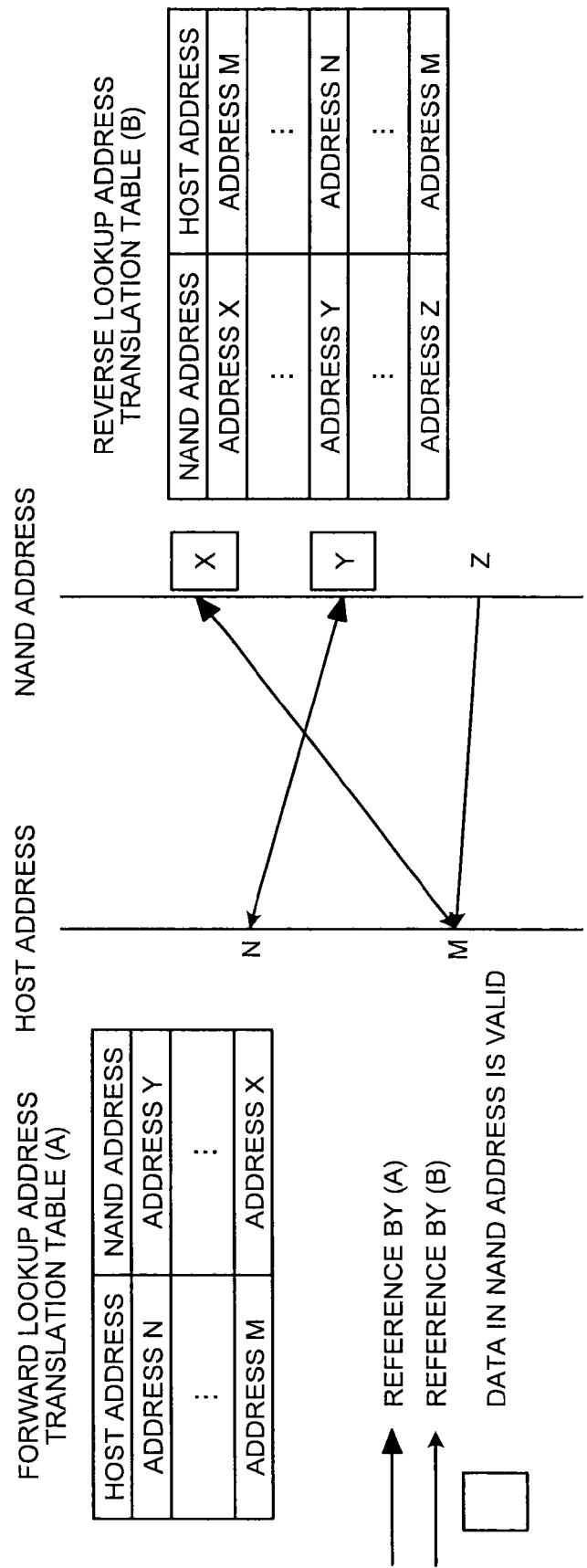
FIG. 17 is a diagram illustrating the configuration of a forward lookup address translation table and a reverse lookup address translation table in the second embodiment.

The procedure of determining whether data is valid data or invalid data by the address-translation-table comparing unit 37 will be explained with reference to FIG. 17 and the flowchart in FIG. 18. An explanation is given of a case of determining whether data in the NAND address X in the reverse lookup address translation table (B) in FIG. 17 is valid or invalid as an example. First, the host address M corresponding to the NAND address X in the reverse lookup address translation table (B) is obtained (Step S201 in FIG. 18). Next, the NAND address X' (X in FIG. 17) corresponding to the host address M is obtained from the forward lookup address translation table (A) in FIG. 17 (Step S202). Then, it is determined whether the data in the NAND address X is valid or invalid on the basis of whether the NAND address X is equal to the NAND address X'. In other words, when the NAND address X is equal to the NAND address X' (Yes in Step S203), it is determined that valid data is present in the NAND address X (Step S204). On the other hand, when the NAND address X is not equal to the NAND address X' (No in Step S203), data in the NAND address X is invalid data (Step S205). In the case of the NAND address X in FIG. 17, X'=X is obtained in Step S202, therefore, it is determined that valid data is present in the NAND address X in Step S203. In a similar manner, it is determined that valid data is present also in the NAND address Y in FIG. 17. On the other hand, for the NAND address Z in FIG. 17, the NAND address X different from the NAND address Z is obtained in Step S202 from the host address M obtained in Step S201. Accordingly, it is determined in Step S203 that data in the NAND address Z is invalid data.

The procedure of the compaction processing using determination of valid/invalid data described above will be explained with reference to the flowchart in FIG. 19. The compaction processing is performed when the number of free blocks becomes small, and, in the following, a case where the compaction processing is performed when the requirements are met will be explained. First, a block in the NAND flash memory 5 as a compaction source is selected (Step S301). Next, the reverse lookup address translation table 52 present in units of blocks is read to the memory 6 from the NAND flash memory 5 by using the reverse-lookup-address-translation-table storage location information (table pointer) 60. The reverse lookup address translation table 62 for the block selected in Step S301 is loaded into the memory 6. Then, it is determined whether data is valid or invalid for each NAND address on the basis of this reverse lookup address translation table 62 and the forward lookup address translation table 61 loaded in the memory 6 (Step S302). The determination in Step S302 is performed on the basis of the flowchart in FIG. 18 described above. The data in the NAND address determined as valid data in Step S302 (Yes in Step S302) is copied to a compaction destination block (Step S303). The host address of the copied data is written in a host address in the reverse lookup address translation table 62 of the compaction destination block. This state will be explained with reference to FIG. 17 and FIG. 20. For example, assume that the reverse lookup address translation table (B) in FIG. 17 is a reverse lookup address translation table of a compaction source. Because it is determined in Step S302 that valid data is present in the NAND addresses X and Y, in Step S303, valid data in the NAND addresses X and Y is copied to the NAND addresses P and Q of the compaction destination block. Accordingly, in the host addresses corresponding to the NAND addresses P and Q in the reverse lookup address translation table (C) in FIG. 20, the host addresses M and N corresponding to the NAND addresses X and Y in the reverse lookup address translation table (B) are written.

In Step S302, when it is determined that data is invalid data (No in Step S302), it is determined whether a NAND address next to the determined NAND address is present (Step S305). In this case, when there is no NAND address in the same block, it is checked whether a different block (NAND address thereof) to be a compaction source is present. When the next NAND address is present (Yes in Step S305), the procedure moves to the next NAND address (Step S306) and it is determined whether data is valid or invalid (Step S302). In Step S305, when the valid/invalid determination is finished for all the data in the NAND addresses in a block that is a compaction source, the next NAND address is not present (No in Step S305), therefore, the procedure returns to Step S301 and a block in the NAND flash memory 5 to be a compaction source is selected again.

After Step S303, in Step S304, it is determined whether the necessary number of free blocks can be reserved by the compaction. When the necessary number of free blocks cannot be reserved (No in Step S304), the procedure moves to Step S305. When the necessary number of free blocks can be reserved (Yes in Step S304), the compaction processing ends.

Figure 18:
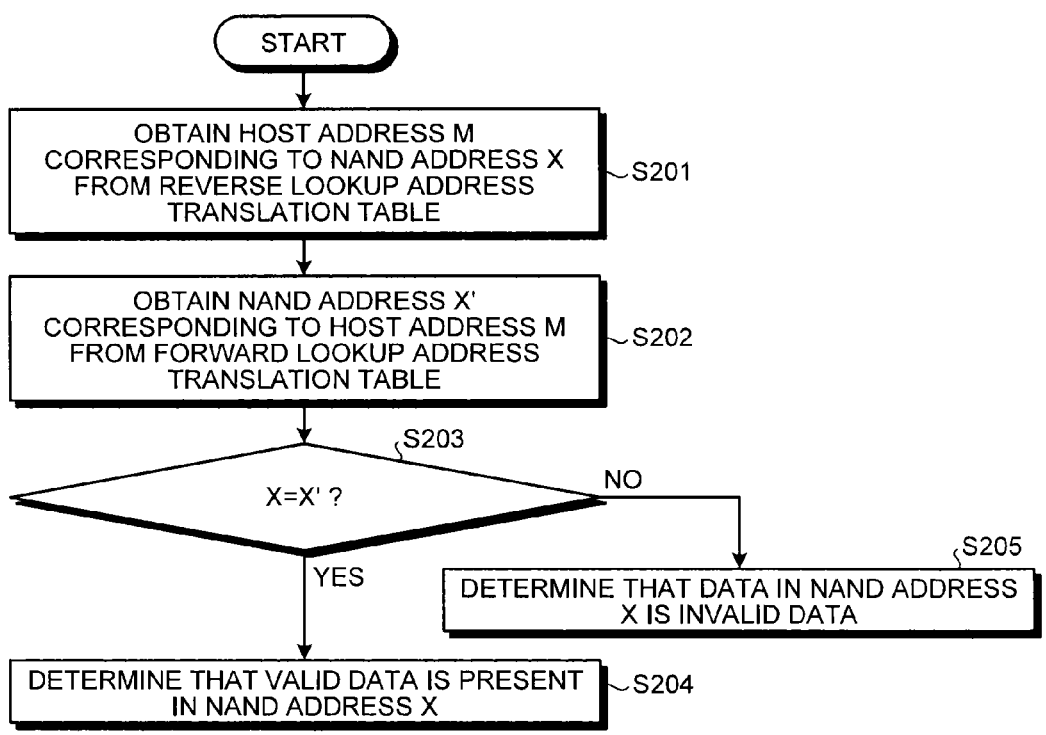
FIG. 18 is a flowchart illustrating a procedure in determining whether data is valid data or invalid data by an address-translation-table comparing unit in the second embodiment.
Figure 19:
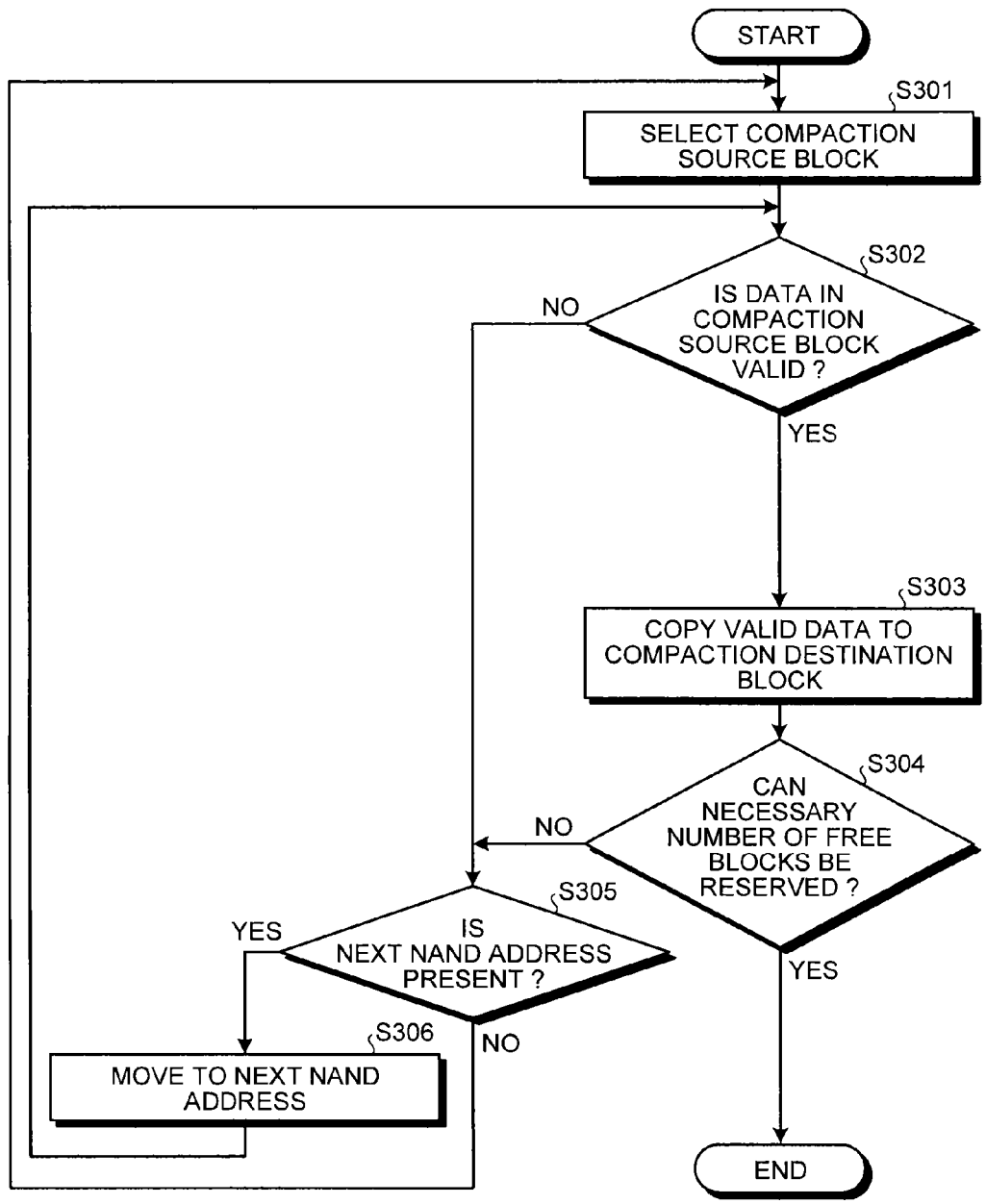
FIG. 19 is a flowchart illustrating a procedure of the compaction processing in the second embodiment.

In the compaction processing in the present embodiment, it is determined whether user data is valid data or invalid data by using both the reverse lookup address translation table 62 and the forward lookup address translation table 61 on the basis of the flowchart in FIG. 18, therefore, for example, the reverse lookup address translation table (B) in FIG. 17 does not need to be updated and made nonvolatile again (written to the NAND flash memory 5), enabling the write amplification factor in the compaction processing to improve.

In the present embodiment, a case where user data is overwritten in the host addresses N and M shown in FIG. 17 will be explained below with reference to the flowchart in FIG. 21 and FIG. 20.

Figure 21:
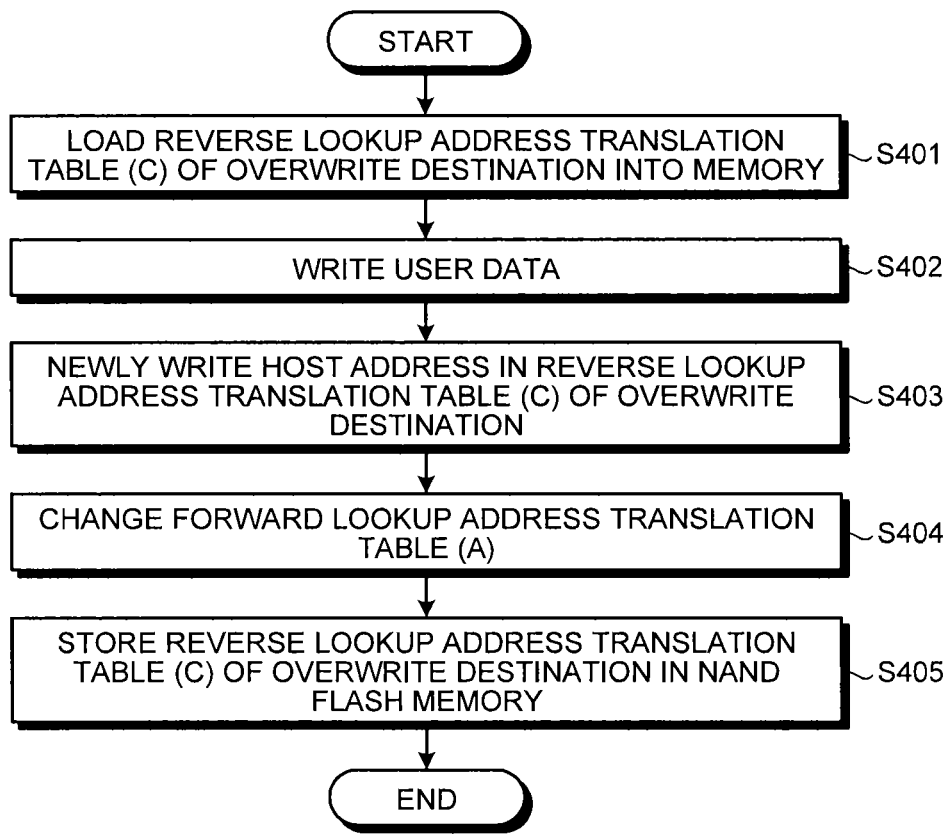
FIG. 21 is a flowchart in a case where user data is overwritten in the second embodiment.

First, the reverse lookup address translation table (C) of an overwrite destination is loaded into the memory 6 from the NAND flash memory 5 in Step S401 in FIG. 21. In this embodiment, when the reverse lookup address translation table (C) is not used, the table is made nonvolatile. Moreover, assume that an invalid value is written in the host addresses corresponding to the NAND addresses P and Q in the reverse lookup address translation table (C). It is sufficient that an invalid value is written upon initialization and when a free block is generated in the compaction processing described above. In other words, the addresses P and Q do not have corresponding host addresses and are writable addresses. A case where new user data is overwritten in the host addresses N and M will be considered as an example of updating the forward and reverse lookup address translation tables. New user data to be written in the addresses N and M is written in the NAND addresses Q and P, respectively (Step S402).

Figure 20:
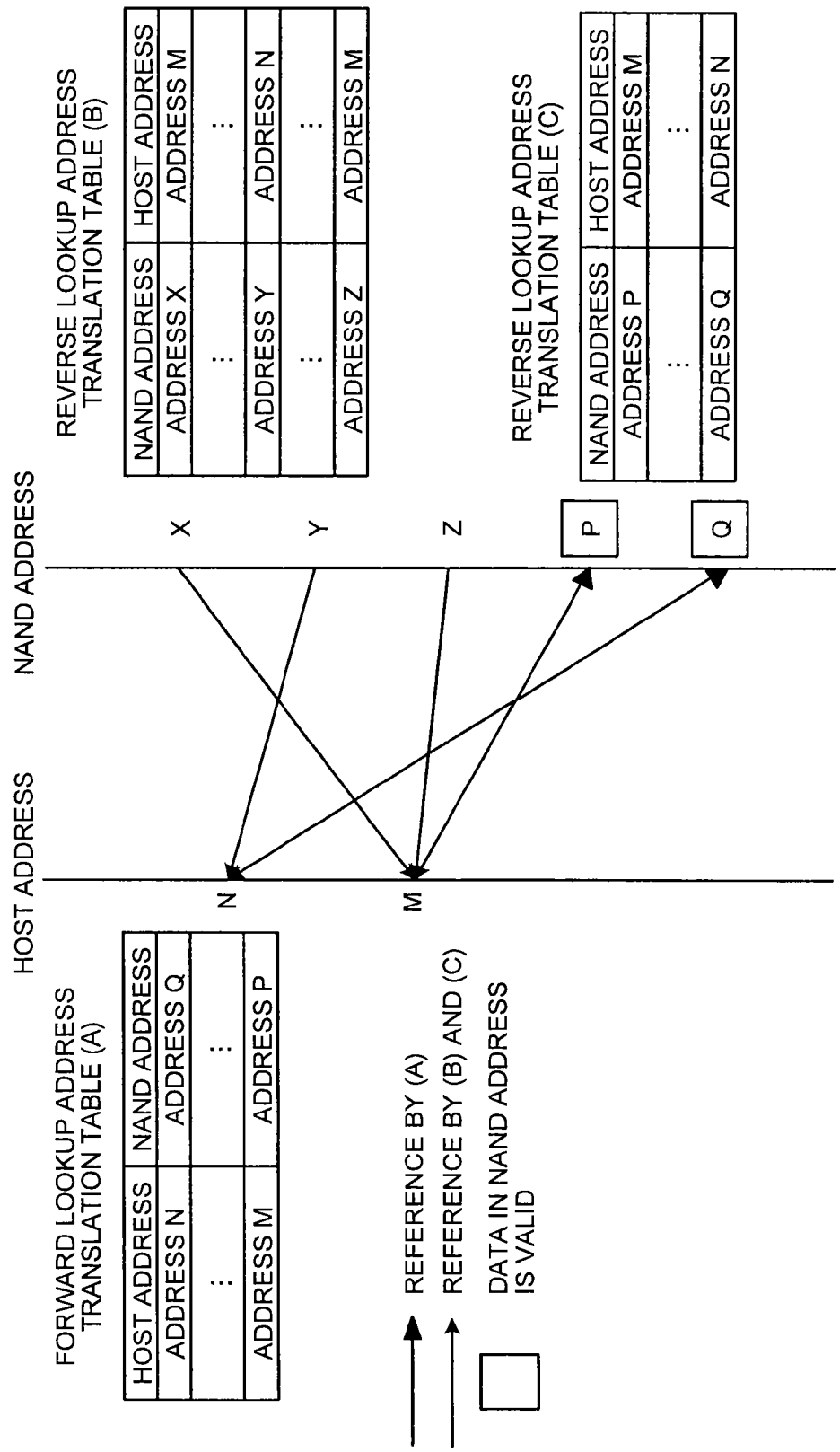
FIG. 20 is a diagram illustrating the configuration of a forward lookup address translation table and reverse lookup address translation tables in the second embodiment.

Next, as shown in FIG. 20, the addresses M and N are newly written in the host addresses corresponding to the NAND addresses P and Q in the reverse lookup address translation table (C) (Step S403). Then, as shown in FIG. 20, the forward lookup address translation table (A) is updated by writing the new NAND addresses Q and P in which user data is newly written in the NAND addresses corresponding to the host addresses M and N in the forward lookup address translation table (A) in FIG. 17 (Step S404). The forward lookup address translation table (A) may also be loaded into the memory 6 when needed. These forward and reverse lookup address translation tables are updated in the memory 6 and thereafter, the reverse lookup address translation table (C) is stored in the NAND flash memory 5 (Step S405). When the reverse lookup address translation table (C) is continuously used, the information thereon may be left in the memory 6. In the case of the compaction, new data is not written in the NAND address P but data written in the address X is copied to the NAND address P and new data is not written in the NAND address Q but data written in the address Y is copied to the NAND address Q, which is different from above.

When the flowchart of overwriting in the present embodiment explained above is compared with the flowchart in FIG. 14 in the second comparison example, loading of the reverse lookup address translation table (B) into the memory 6 (Step S101), writing of an invalid value to a host address in the reverse lookup address translation table (B) (Step S104), and storing of the reverse lookup address translation table (B) in the NAND flash memory 5 (Step S107) are not needed, therefore, it is found that the write amplification factor can be improved also in overwriting.

As explained above, in the present embodiment, it is not needed to load all the reverse lookup address translation tables that are needed when the compaction processing is performed into the memory, therefore, the overhead can be reduced and the write amplification factor can be improved while reducing the memory usage. In other words, when data is invalidated due to overwriting of user data and the compaction, it is not needed to update the reverse lookup address translation table by inputting an invalid value. Thus, even if the reverse lookup address translation table is made nonvolatile, it is not needed to update the reverse lookup address translation table including a NAND address to be invalidated and make the reverse lookup address translation table nonvolatile again. Moreover, it is also not needed to read the reverse lookup address translation table including a NAND address to be invalidated when overwriting is performed from a nonvolatile memory.

Third Embodiment

In an SSD in which the above-described compaction operation is performed, the compaction occurs frequently depending on an access pattern, which may degrade the performance. In the following embodiment, an explanation is given of a control method of a memory system that solves this problem by having a simple and lightweight access pattern predictive function.

In an SSD (Solid State Drive), when a data erasing unit (block) is different from a data management unit, according to the progress of rewriting of a flash memory, blocks are made porous due to invalid (non-latest) data. When blocks in such a porous state increase, substantially usable blocks decrease and a storage area of the flash memory cannot be effectively used. Therefore, for example, when the number of free blocks (block which does not include valid data therein and for which a use is not allocated) of the flash memory becomes less than a predetermined threshold, the flash memory is organized, for example, by performing the compaction of collecting valid latest data and rewriting the data in a different block, thereby reserving a free block for which a use is not allocated.

When the compaction occurs, original processing of an SSD, such as writing data from a host and reading data specified from a host, is affected and the performance of the SSD degrades. Therefore, it is desirable that the compaction is less apt to occur.

In an SSD capable of recording in the SLC mode and the MLC mode, when data from a host is written in the SLC mode, writing can be performed at high speed, however, if the compaction occurs, writing of data from the host and writing in the compaction occur in parallel, therefore, the write speed of the SSD decreases in some cases.

In normal use by a PC user, the write address range to the SSD is limited, therefore, writing is completed by the recording in the SLC mode in most cases and the compaction does not occur. Thus, the write speed of the SSD does not decrease.

On the other hand, in the case of applications for use of, for example, performing a sequential write (basically, writing to sequential LBA addresses) on the entire flash memory of the SSD, when data from the host is written in the flash memory in the SLC mode, if a four-value MLC mode is used, blocks are depleted when writing is performed on the flash memory to approximately a half of the capacity in terms of the MLC mode. This is because the capacity of the SSD is determined on the assumption that writing is performed in the MLC mode. Thereafter, the compaction processing of rewriting data, which is already written in a block in the SLC mode, in the MLC mode continues in parallel with writing from the host.

At this time, if the amount of data written from the host is one, the amount of data written in the SLC mode is two (half of the amount of data written in the MLC mode) and the amount of data rewritten in the MLC mode in the compaction processing is one, therefore, totally, three data writings occur in a flash memory and thus the write amplification factor becomes three. The write amplification factor is statistics of the amount of erasing in a block with respect to the amount of data written from the host in a predetermined term and a flash memory having a lower write amplification factor has a lower wear degree.

Moreover, in applications for use, for example, in industrial equipment (for example, digital video recorder) in which a real time performance is required, there is a problem in that a drive whose performance varies depending on whether the compaction is performed is hard to use.

Thus, in the present embodiment, a write pattern, such as a sequential write, is predicted, and, when it is predicted that a write pattern is a sequential write, data is written in the MLC mode so that the compaction is less apt to occur. If the prediction processing of a write pattern is complicated, the prediction processing becomes an overhead and the basic performance degrades, therefore, the present embodiment uses a simple and lightweight prediction method on the basis of the empirical rule. Other than a sequential write, even in an access pattern in which writing in a narrow address range in a drive is performed a plurality of timers in the short term, the address range to be accessed is sequentially moved, and writing is performed over the entire drive in the long term, if writing is performed in the MLC mode, the compaction becomes hard to occur, therefore, the present embodiment also enables such a pattern to be predicted.

Figure 22:
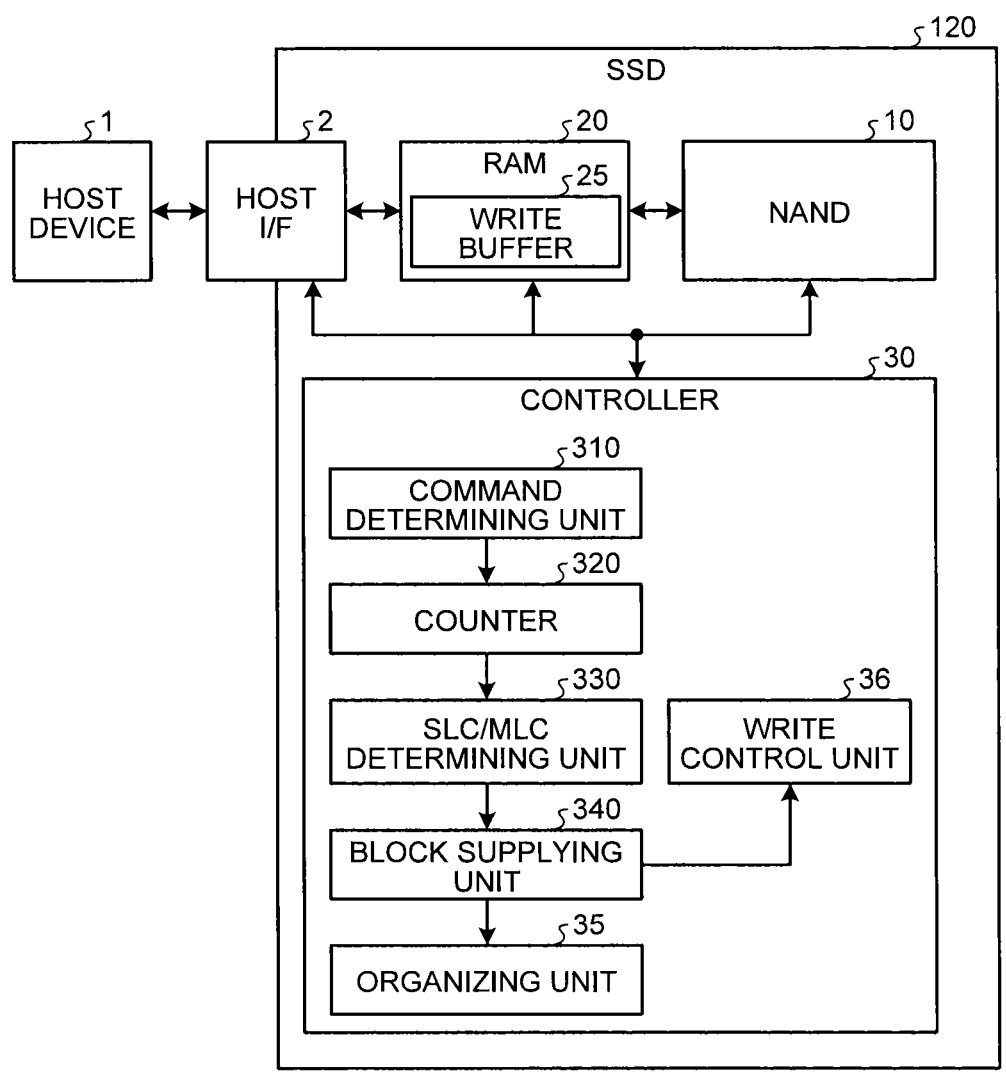
FIG. 22 is a block diagram illustrating an internal configuration example of an SSD

FIG. 22 is a block diagram illustrating a configuration example of an SSD (Solid State Drive) 120 that is a memory system. The SSD 120 is connected to the host device (hereinafter, host) 1, such as a personal computer or a CPU, via the host interface 2, such as an ATA interface (ATA I/F), and functions as an external storage device of the host 1. Examples of the host 1 include a personal computer and a CPU of an imaging device, such as a still camera and a video camera. The SSD 120 includes the host interface 2, the NAND-type flash memory (hereinafter, NAND) 10 that is a nonvolatile semiconductor memory, the RAM 20 that is a semiconductor memory capable of performing a high-speed access compared with the NAND 10, and the controller 30.

The NAND 10 stores therein user data specified by the host 1 and management information managed in the RAM 20 for backup. The NAND 10 includes a memory cell array in which a plurality of memory cells is arrayed in a matrix manner. The NAND 10 includes a plurality of memory chips and each memory chip is configured by arraying a plurality of blocks such that one block is one unit for data erasing. In the NAND 10, writing and reading of data is performed for each page. A block consists of a plurality of pages. The NAND 10 is a flash memory capable of switching the data writing operation mode to any of the SLC mode and the MLC mode. In other words, writing can be performed on a block in the SLC mode and in the MLC mode.

The RAM 20 includes a storage area as the write buffer 25 for temporarily storing data when the data is written from the host 1 to the NAND 10, a storage area for storing and updating the management information stored in the NAND 10 in a nonvolatile manner, and a work area, for example, for temporarily storing data read from the NAND 10.

When the host 1 performs data writing on the SSD 120, the host 1 inputs a write command including an LBA (Logical Block Addressing) as a logical address and the data size and write data to the SSD 120 via the host interface 2. An LBA is a logical address in which serial numbers starting from zero are attached to sectors (size: for example, 512 B) and indicates a top address of data. The data size indicates the number of sectors. In the present embodiment, as a unit for managing data in the write buffer 25 and the NAND 10, a management unit, which is larger than the sector size and is smaller than the physical block size, is used. The management unit is different from the block size, therefore, the above-described compaction is needed as the progress of rewriting of the NAND 10.

The controller 30 includes a command determining unit 310, a counter 320, an SLC/MLC determining unit 330, a block supplying unit 340, the organizing unit 35, and a write control unit 36 as components relating to the present embodiment.

The command determining unit 310 analyzes a command received from the host 1 and updates the counter 320 on the basis of the analysis result.

The count value of the counter 320 is updated by the command determining unit 310 and switching of whether to select the SLC mode or the MLC mode is performed by using this count value.

The SLC/MLC determining unit 330 compares the count value of the counter 320 with a threshold T1, selects the MLC mode when the count value is equal to or larger than the threshold T1, and selects the SLC mode when the count value is smaller than the threshold T1.

The block supplying unit 340 supplies a free block, to which a use is not allocated, to the organizing unit 35 and the write control unit 36. When a free block is supplied to the write control unit 36, the block supplying unit 340 supplies a free block to the write control unit 36 together with the determination result of the SLC/MLC determining unit 330.

The organizing unit 35 performs the data organizing (compaction) in the NAND 10. In other words, when the number of free blocks in the NAND 10 becomes less than a predetermined threshold, the organizing unit 35 performs the compaction of collecting valid data in blocks and rewriting the valid data to a different block, thereby reserving a free block. The organizing unit 35 first performs the compaction of setting a block in the SLC mode as a compaction source block and writing to a compaction destination block in the MLC mode and then, when a sufficient number of free blocks cannot be reserved, performs the compaction of setting a block in the MLC mode as a compaction source block and writing to a compaction destination block in the MLC mode. A free block supplied from the block supplying unit 340 is used as a compaction destination block. The organizing unit 35 updates the management information that manages a correspondence between a logical address (LBA) of data and a physical address indicating a recording location in the NAND 10 according to the compaction.

After once buffering write data from the host 1 to the write buffer 25, the write control unit 36 writes the write data to the NAND 10. When the write control unit 36 performs data writing on the NAND 10, the write control unit 36 performs data writing by using a free block supplied from the block supplying unit 340 according to the instructed recording mode (any of the SLC mode and the MLC mode). The write control unit 36 updates the management information that manages a correspondence between a logical address (LBA) of write data and a physical address indicating a recording location in the NAND 10 according to the writing to the NAND 10.

Figure 23:
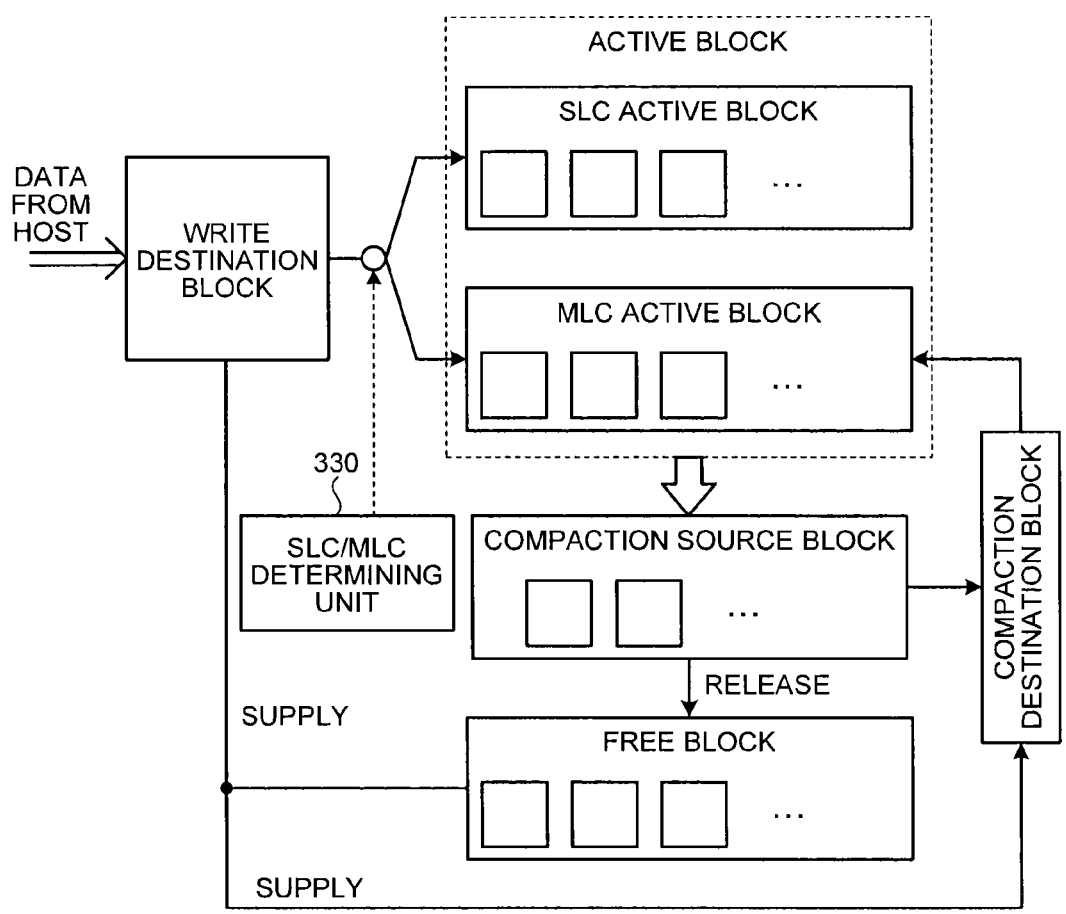
FIG. 23 is a diagram conceptually illustrating block management.

FIG. 23 is a diagram conceptually illustrating block management in the SSD 120. Blocks are classified into an active block, which includes valid data inside, and a free block, which does not include valid data inside and to which a use is not allocated. For example, when data in the same LBA is overwritten, the following operation is performed. Assume that valid data of the block size is stored in a logical address A1 and a block B1 is used as a storage area. When a command to overwrite update data of the block size in the logical address A1 is received from the host 1, one free block (referred to as a block B2) is reserved and the data received from the host 1 is written in the free block. Thereafter, the logical address A1 is associated with the block B2. Consequently, the block B2 becomes an active block AB and the data stored in the block B1 becomes invalid, therefore the block B1 becomes a free block FB.

In this manner, in the SSD 120, even for the data in the same logical address A1, a block actually used as a recording area changes every time writing is performed. When update data of the block size is written, a write destination block always changes, however, when update data of less than the block size is written, the update data is written in the same block in some cases. For example, when page data less than the block size is updated, old page data in the same logical address in the block is invalidated and the latest page data, which is newly written, is managed as a valid page. When all the data in the block is invalidated, the block is released as a free block FB.

Data from the host 1 is written in a write destination block (free block). When writing is performed on this write destination block, writing is performed in any of the SLC mode and the MLC mode on the basis of the determination result of the SLC/MLC determining unit 330. The block written in the SLC mode becomes an SLC active block and the block written in the MLC mode becomes an MLC active block. In this manner, in the NAND 10, an SLC active block and an MLC active block are mixed. According to the progress of rewriting of the NAND 10, an active block is released as a free block or released as a free block after becoming a write source block in the compaction. The free block is thereafter used as a write destination block for writing user data from the host 1 or a compaction destination block for writing data in the compaction.

Figure 24:
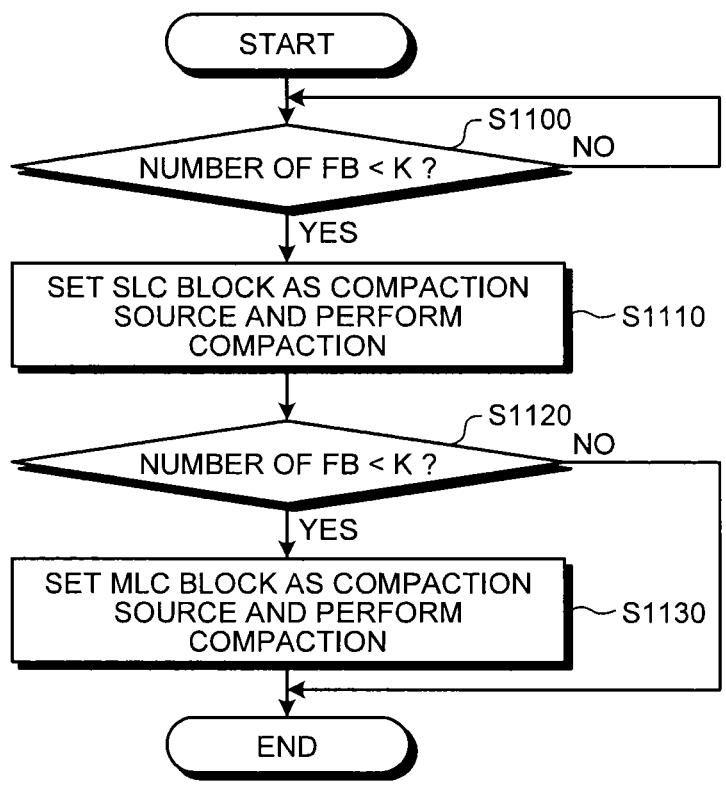
FIG. 24 is a flowchart illustrating a processing procedure of the compaction.

FIG. 24 is a flowchart illustrating the compaction processing procedure performed by the organizing unit 35. When the organizing unit 35 determines that the number of free blocks (FB) becomes lower than a threshold K (Step S1100), the organizing unit 35 first performs a first compaction of setting an SLC active block as a compaction source block, collecting valid data from compaction source blocks, and writing the collected valid data in a free block of a compaction destination in the MLC mode (Step S1110). When the organizing unit 35 determines that the number of free blocks becomes equal to or larger than the threshold K by the first the compaction (Step S1120), the organizing unit 35 ends the NAND organizing at this point. However, when the number of free blocks does not become equal to or larger than the threshold K by the first the compaction, the organizing unit 35 performs a second compaction of setting an MLC active block as a compaction source block, collecting valid data from compaction source blocks, and writing the collected valid data in a free block of a compaction destination in the MLC mode (Step S1130). The organizing unit 35 updates the management information that manages a correspondence between a logical address (LBA) of data and a physical address indicating a recording location in the NAND 10 according to this NAND organizing.

Figure 25:
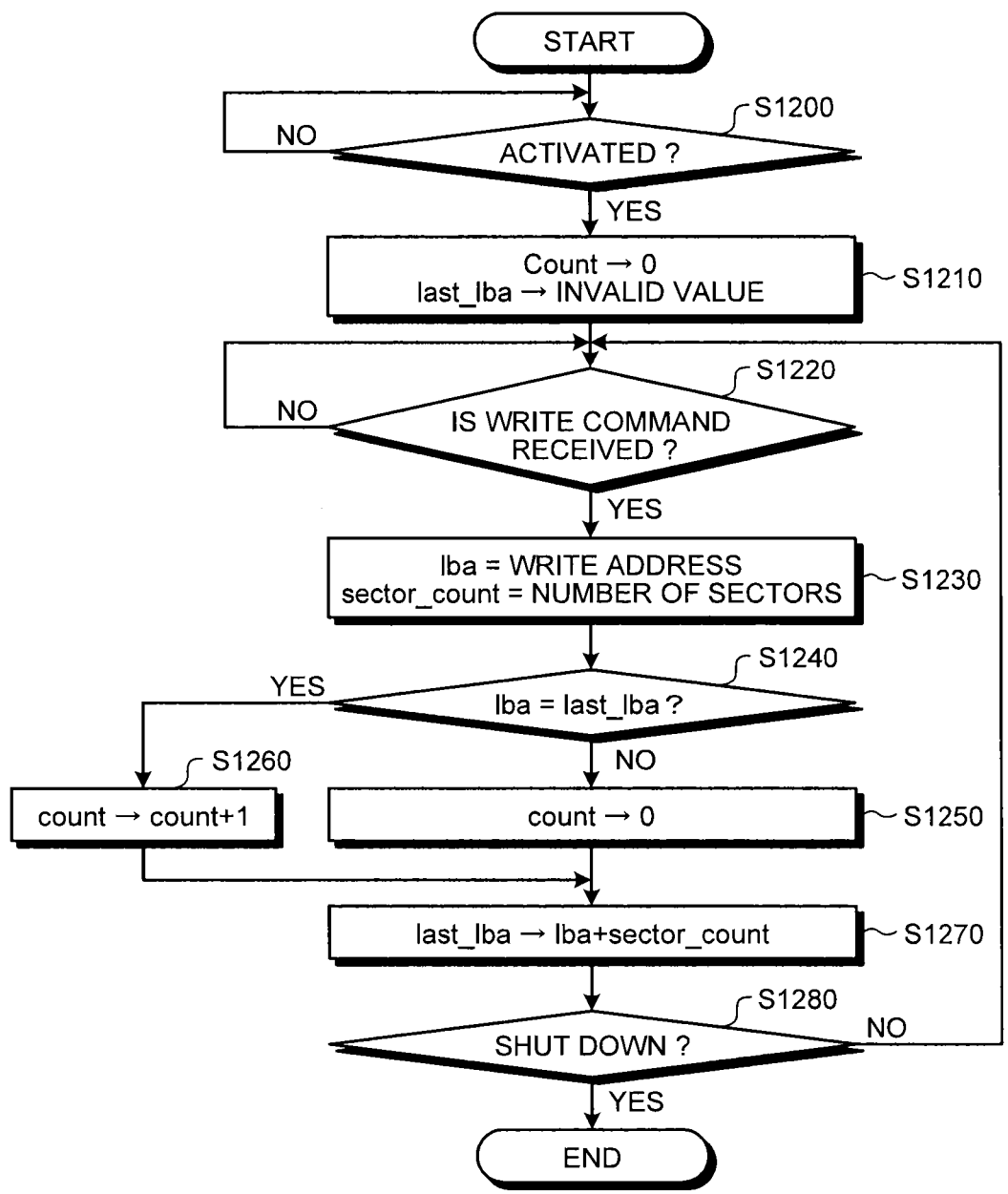
FIG. 25 is a flowchart illustrating part of the procedure of determining a sequential write in a third embodiment.

FIG. 25 is a flowchart illustrating an operation procedure of the command determining unit 310 of the controller 30 in the third embodiment. In the third embodiment, it is determined that a sequential write is performed on the basis of the address continuity. In other words, if a write request having a continuous address continues a predetermined number of times or more, it is predicted that a sequential write continues thereafter and data in the MLC mode is written in the NAND 10.

When the SSD 120 is activated (Step S1200), the command determining unit 310 initializes a counter variable count to zero and initializes an end address variable last_lba to an invalid value (for example, −1) (Step S1210). The counter variable count is indicated as the counter 320 and the address continuity is determined on the basis of the count value of the counter 320. The end address variable last_lba indicates an address next to the end address specified by the last command from the host 1 (address obtained by adding one to an end address). An address assigned to the end address variable last_lba is thereafter referred to as an (end+1) address.

When a write command is input from the host 1 (Step S1220), the command determining unit 310 interprets the command. As described above, the write command includes address information AD indicating a top address of write data and the number of sectors SZ indicating the data size. The command determining unit 310 assigns the address information AD on the write command to a variable lba and assigns the number of sectors SZ to a variable sector_count (Step S1230).

The command determining unit 310 compares the variable lba with the variable last_lba (Step S1240). If they do not match, the command determining unit 310 clears the variable count to zero (Step S1250), and, if they match, the command determining unit 310 increments the variable count, that is, the counter 320, by one (Step S1260). Furthermore, the command determining unit 310 assigns a value obtained by adding the variable sector_count to the variable lba, that is, the (end+1) address, which is an address next to the end address of data specified by the current write command, to the variable last_lba (Step S1270). Such processing is repeatedly performed until the SSD 120 is shut down (Step S1280).

When a write command is received for the first time, an invalid value is set to the variable last_lba, therefore, the variable lba does not match the variable last_lba in Step S1240, the variable count is cleared to zero (Step S1250), and the (end+1) address, which is an address next to the end address of a current write command, is set to the variable last_lba (Step S1270). Thus, thereafter, when a write command including a continuous address is input from the host 1, comparison in Step S1240 is a match and the variable count is sequentially counted up. On the other hand, when a write command including a discontinuous address is input from the host 1, comparison in Step S1240 is a mismatch and the variable count is cleared to zero.

Figure 26:
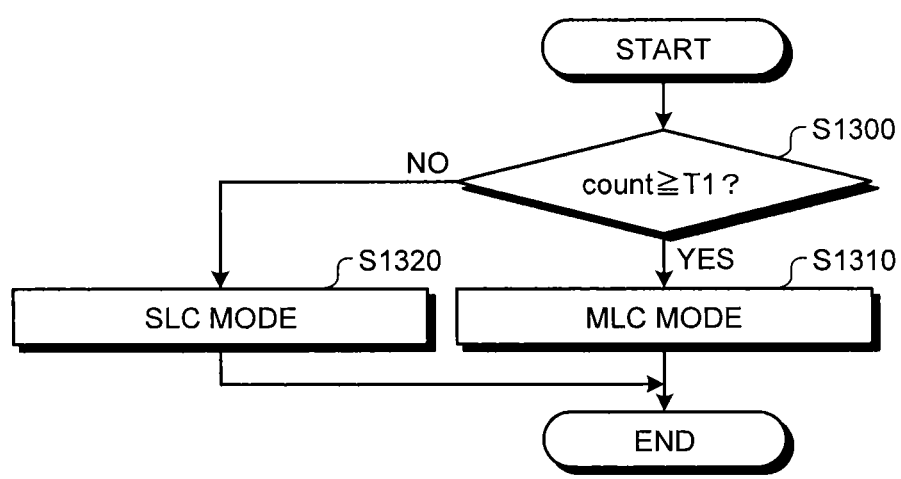
FIG. 26 is a flowchart illustrating a remainder of the procedure of determining a sequential write in the third embodiment.

FIG. 26 is a flowchart illustrating an operation procedure of the SLC/MLC determining unit 330. The SLC/MLC determining unit 330 compares a value of the variable lba, that is, a count value of the counter 320, with the threshold T1 (Step S1300). When the count value of the counter 320 is equal to or larger than the threshold T1, the SLC/MLC determining unit 330 selects the MLC mode (Step S1310), and, when the count value of the counter 320 is smaller than the threshold T1, the SLC/MLC determining unit 330 selects the SLC mode (Step S1320). In other words, when a write request having a continuous address continues equal to or more than the threshold T1, the SLC/MLC determining unit 330 selects the MLC mode. The SLC/MLC determining unit 330 notifies the block supplying unit 340 of the selected recording mode. The block supplying unit 340 notifies the write control unit 36 of the recording mode that is a selection result by the SLC/MLC determining unit 330 and the block number indicating a free block to which data needs to be written. The write control unit 36 uses the free block whose block number is notified as a write destination block and performs writing on this write destination block in the notified recording mode (MLC mode or SLC mode).

Consequently, when addresses continue to have a predetermined size or more, writing in the MLC mode is performed, otherwise writing in the SLC mode is performed.

Figure 27:
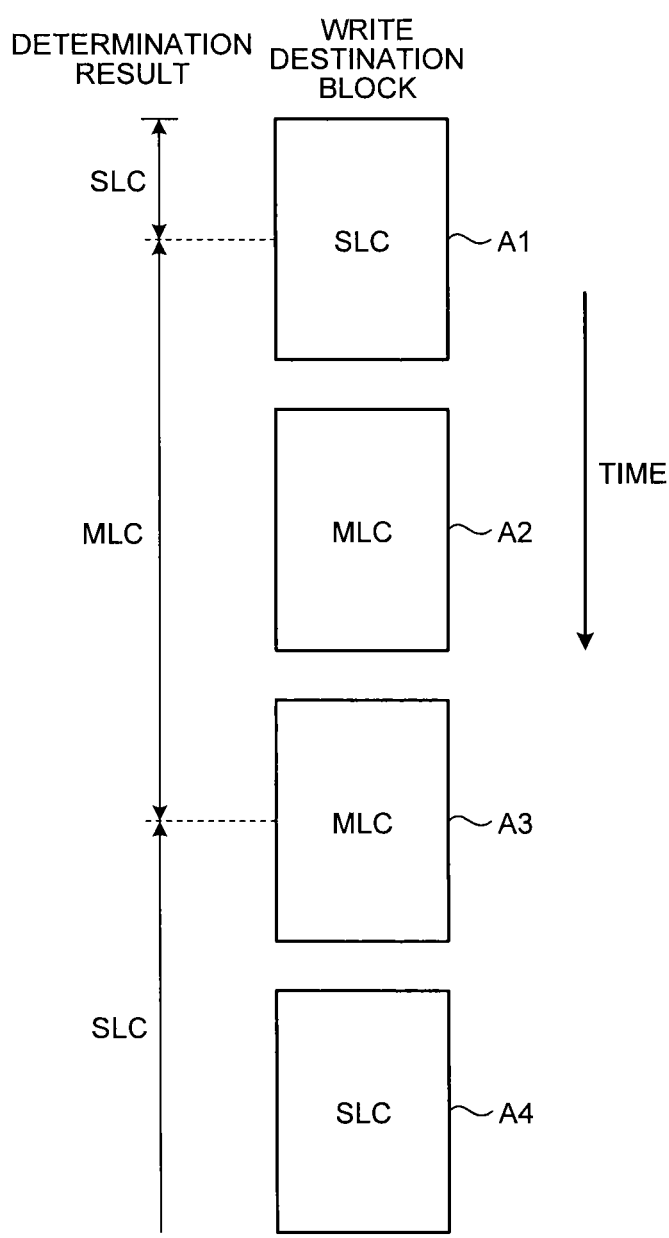
FIG. 27 is a conceptual diagram illustrating the relationship between a determination point and switching timing of a recording mode.

However, as shown in FIG. 27, switching of the recording mode cannot be performed during writing to a block. For example, while data is written in a block A1 in the SLC mode, even if there is a determination result to switch the recording mode from the SLC mode to the MLC mode, data continues to be written to the block A1 in the SLC mode. In other words, when there is a determination result to switch the recording mode from the SLC mode to the MLC mode during data writing to a block, the recording mode is not switched until writing to the block is finished. Then, when a write destination block is changed to the next block A2, the recording mode is switched from the SLC mode to the MLC mode. In a similar manner, the recording mode is changed from the MLC mode to the SLC mode when a write destination block is changed.

In this manner, in the third embodiment, when data from the host is written, if a write request having a continuous address continues equal to or more than the threshold T1, writing in the MLC mode is performed and, otherwise writing in the SLC mode is performed. Therefore, a write pattern, such as a sequential write, is predicted by using a simple and lightweight prediction method and the compaction is less apt to occur, thus a decrease in write speed of the SSD is suppressed, whereby a write operation with high write amplification factor can be implemented without degrading the basic performance.

Fourth Embodiment

Figure 28:
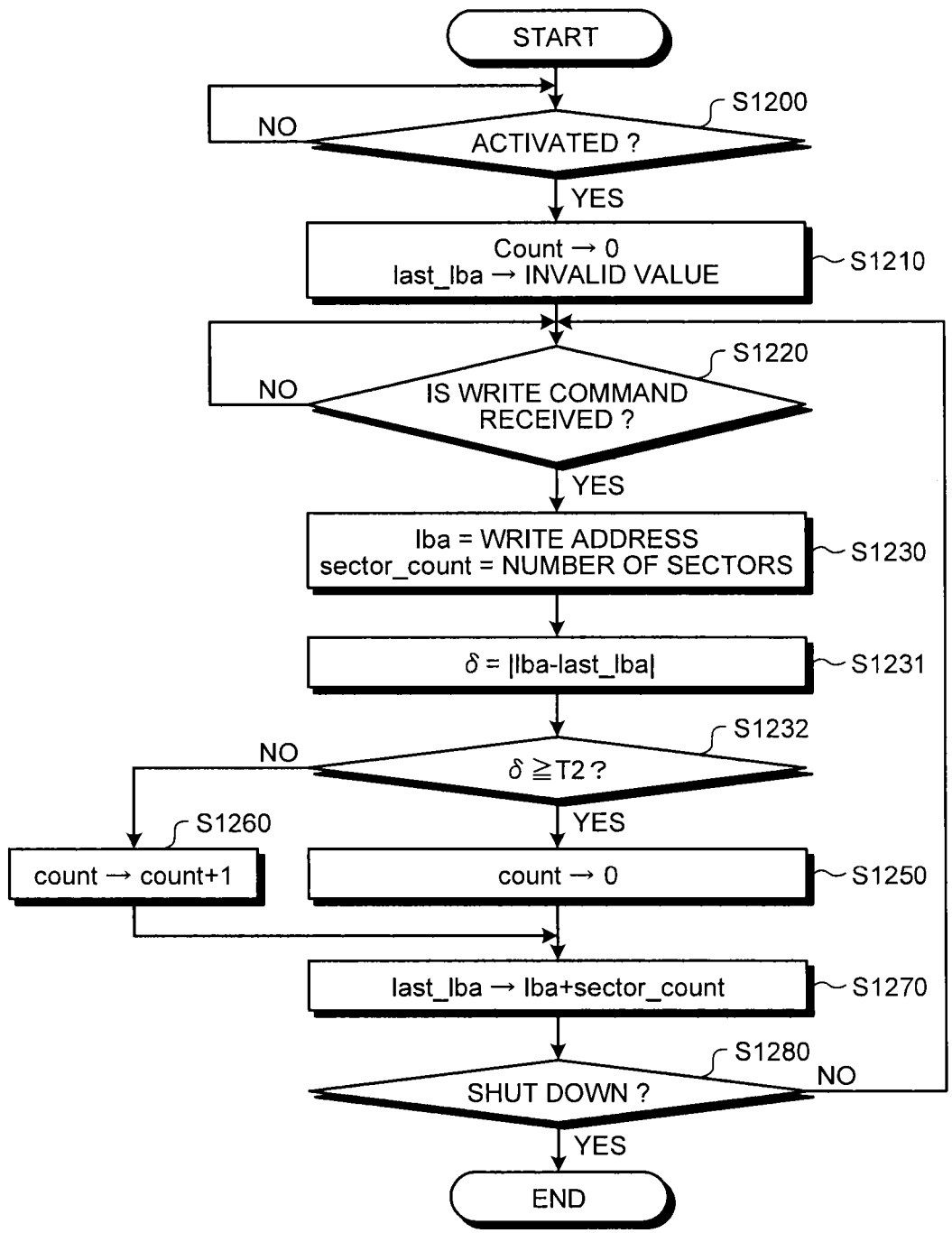
FIG. 28 is a flowchart illustrating part of the procedure of determining a sequential write in a fourth embodiment.

In the fourth embodiment, when the address continuity is determined, address skipping within a predetermined range is allowed. Therefore, when address skipping is within the predetermined range, it is determined that addresses continue. In other words, even if addresses are not completely continued between the current write command and the next write command, if address skipping is within the predetermined range, it is determined that the addresses continue. FIG. 28 is a flowchart illustrating an operation procedure of the command determining unit 310 in the fourth embodiment. In FIG. 28, Steps S1231 and S1232 are added to the flowchart in FIG. 25. In FIG. 28, steps in which processing the same as that in FIG. 25 is performed are denoted by the same step numbers.

When the SSD 120 is activated (Step S1200), the command determining unit 310 initializes the counter variable count to zero and initializes the end address variable last_lba to an invalid value (for example, −1) (Step S1210). When a write command is input from the host 1 (Step S1220), the command determining unit 310 interprets the command and assigns the address information AD on the write command to the variable lba and assigns the number of sectors SZ to the variable sector_count (Step S1230).

The command determining unit 310 calculates an absolute value δ of a difference between the variable lba and the variable last_lba (Step S1231). In other words, in Step S1231, the difference between the (end+1) address, which is an address next to the end address of data specified by the last write command, and the top address relating to data specified by the current write command is derived.

Next, the command determining unit 310 determines whether the difference δ is equal to or larger than a threshold T2. When the difference δ is equal to or larger than the threshold T2, the command determining unit 310 determines that the addresses do not have continuity and clears the variable count to zero (Step S1250). When the difference δ is smaller than the threshold T2, the command determining unit 310 determines that the addresses have continuity and increments the variable count, that is, the counter 320, by one (Step S1260). Furthermore, the command determining unit 310 assigns a value obtained by adding the variable sector_count to the variable lba, that is, the (end+1) address, which is an address next to the end address of data specified by the current write command, to the variable last_lba (Step S1270). Such processing is repeatedly performed until the SSD 120 is shut down (Step S1280).

In a similar manner to FIG. 26, the SLC/MLC determining unit 330 determines the recording mode (SLC mode or MLC mode). In other words, the SLC/MLC determining unit 330 compares the value of the variable count, that is, the count value of the counter 320, with the threshold T1 (Step S1300). When the count value of the counter 320 is equal to or larger than the threshold T1, the SLC/MLC determining unit 330 selects the MLC mode (Step S1310) and, when the count value of the counter 320 is smaller than the threshold T1, the SLC/MLC determining unit 330 selects the SLC mode (Step S1320). Thereafter, the operation similar to the third embodiment is performed. The third embodiment corresponds to determining whether the difference δ is equal to zero in Step S1232 in the fourth embodiment.

In this manner, in the fourth embodiment, when the address continuity is determined, address skipping within the predetermined range is allowed. Therefore, when address skipping is within the predetermined range, it is determined that addresses continue. Thus, a write pattern belonging to a sequential write is predicted by using a simple and lightweight prediction method and the compaction is less apt to occur, thus a decrease in write speed of the SSD is suppressed, whereby a write operation with high write amplification factor can be implemented without degrading the basic performance.

Fifth Embodiment

Figure 29:
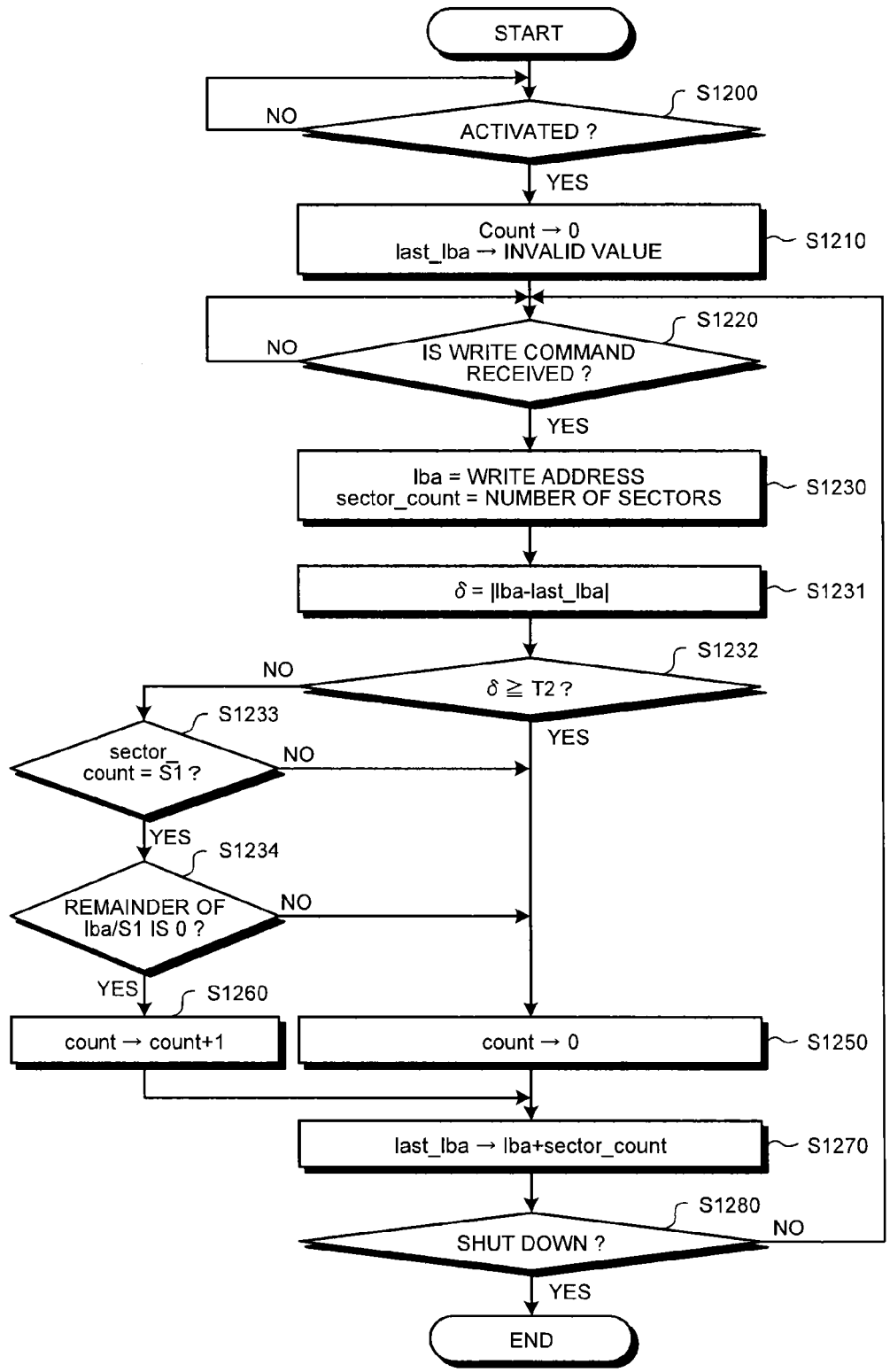
FIG. 29 is a flowchart illustrating part of the procedure of determining a sequential write in the fifth embodiment.

In the fifth embodiment, the access size (the number of sectors SZ) often used in a sequential write and alignment of an address (the address information AD included in a write command) often used in a sequential write are added as a predictor, thereby improving the reliability of prediction. FIG. 29 is a flowchart illustrating an operation procedure of the command determining unit 310 in the fifth embodiment. In FIG. 29, the access size and the alignment of an address are added to the processing procedure in the fourth embodiment shown in FIG. 28 as a predictor. In FIG. 29, Steps S1233 and S1234 are added to the flowchart in FIG. 28. In FIG. 29, steps in which processing the same as that in FIG. 28 is performed are denoted by the same step numbers.

When the SSD 120 is activated (Step S1200), the command determining unit 310 initializes the counter variable count to zero and initializes the end address variable last_lba to an invalid value (for example, −1) (Step S1210). When a write command is input from the host 1 (Step S1220), the command determining unit 310 interprets the command and assigns the address information AD on the write command to the variable lba and assigns the number of sectors SZ to the variable sector_count (Step S1230).

The command determining unit 310 calculates the absolute value δ of a difference between the variable lba and the variable last_lba (Step S1231). Next, the command determining unit 310 determines whether the difference δ is equal to or larger than the threshold T2. When the difference δ is equal to or larger than the threshold T2, the command determining unit 310 determines that the addresses do not have continuity and clears the variable count to zero (Step S1250).

When the difference δ is smaller than the threshold T2, next, the command determining unit 310 determines whether the variable sector_count matches a predetermined value S1 (Step S1233). As the value S1, for example, 128 KiB is used as the access size often used in a sequential write. If the variable sector_count does not match the predetermined value S1, the command determining unit 310 determines that writing is not a sequential write and clears the variable count to zero (Step S1250).

When the determination in Step S1233 is Yes, next, the command determining unit 310 determines whether a remainder obtained by dividing the variable lba by the value S1 is zero. When the remainder is not zero, the command determining unit 310 determines that writing is not a sequential write and clears the variable count to zero (Step S1250). When the remainder is zero, that is, when all the requirements in Steps S1232, S1233, and S1234 are satisfied, the command determining unit 310 determines that writing is a sequential write and increments the variable count, that is, the counter 320, by one (Step S1260). Furthermore, the command determining unit 310 assigns a value obtained by adding the variable sector_count to the variable lba, that is, the (end+1) address, which is an address next to the end address of data specified by the current write command, to the variable last_lba (Step S1270). Such processing is repeatedly performed until the SSD 120 is shut down (Step S1280).

In a similar manner to FIG. 26, the SLC/MLC determining unit 330 determines the recording mode (SLC mode or MLC mode). In other words, the SLC/MLC determining unit 330 compares the value of the variable count, that is, the count value of the counter 320, with the threshold T1 (Step S1300). When the count value of the counter 320 is equal to or larger than the threshold T1, the SLC/MLC determining unit 330 selects the MLC mode (Step S1310) and, when the count value of the counter 320 is smaller than the threshold T1, the SLC/MLC determining unit 330 selects the SLC mode (Step S1320). Thereafter, the operation similar to the third embodiment is performed.

In FIG. 29, the access size (Step S1233) and the alignment of an address (Step S1234) are added to the processing procedure in the fourth embodiment as a predictor, however, any one of the access size (Step S1233) and the alignment of an address (Step S1234) may be added to the processing procedure in the fourth embodiment. Moreover, at least one of the access size (Step S1233) and the alignment of an address (Step S1234) may be added to the processing procedure in the third embodiment as a predictor.

In this manner, in the fifth embodiment, because at least one of the access size and the alignment of an address often used in a sequential write is added as a predictor, the reliability when predicting whether writing is a sequential write can be improved by a simple method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile semiconductor memory including a plurality of blocks, each of the blocks being a unit of erasing; and
a controller that includes:
a write control unit that writes data from a host device in a block of the nonvolatile semiconductor memory; and
an organizing unit that sequentially determines whether each data stored in the blocks is valid or invalid, the organizing unit performing data organizing, the data organizing including selecting data determined as being valid and rewriting the data in a new block, wherein
the controller controls write processing by the write control unit and rewriting to the new block by the organizing unit alternately at a predetermined data ratio, and
while performing the data organizing, when a determination result becomes invalid consecutively for a predetermined number of times or more, the controller ends the data organizing by the organizing unit, and starts the write processing by the write control unit.

2. The memory system according to claim 1, wherein, while performing the data organizing, when the determination result becomes invalid consecutively for the predetermined number of times or more, the organizing unit writes invalid dummy data to the new block.

3. The memory system according to claim 2, further comprising an address translation table that manages forward lookup information that associates a logical address specified from the host device with a storage location in the nonvolatile semiconductor memory, wherein
the write control unit writes data to which reverse lookup information including a logical address of the data is added in a block of the nonvolatile semiconductor memory, and
the organizing unit determines whether each data is valid or invalid by comparing reverse lookup information added to each data with forward lookup information in the address translation table.

4. The memory system according to claim 2, wherein, when the data organizing continues for a predetermined time or longer, the controller interrupts the data organizing by the organizing unit and causes the write control unit to perform the write processing.

5. The memory system according to claim 1, further comprising an address translation table that manages forward lookup information that associates a logical address specified from the host device with a storage location in the nonvolatile semiconductor memory, wherein
the write control unit writes data to which reverse lookup information including a logical address of the data is added in a block of the nonvolatile semiconductor memory, and
the organizing unit determines whether each data is valid or invalid by comparing reverse lookup information added to each data with forward lookup information in the address translation table.

6. The memory system according to claim 1, wherein, when the data organizing continues for a predetermined time or longer, the controller interrupts the data organizing by the organizing unit and causes the write control unit to perform the write processing.

7. A memory system comprising:
a nonvolatile memory that stores user data, a forward lookup address translation table that manages a physical address of the user data corresponding to a host address, and a reverse lookup address translation table that manages a host address corresponding to a physical address and does not include registered information indicating whether the user data is valid or invalid, the nonvolatile memory including a plurality of blocks;
a memory; and
a controller that reads, in the memory, the forward lookup address translation table,
selects a block to be a compaction source,
reads, in the memory, an address translation table being a part of the reverse lookup address translation table stored in the nonvolatile memory and corresponding to the selected block,
includes an address-translation-table comparing unit that obtains a first host address corresponding to a first physical address in the read address translation table by using the read address translation table, obtains a second physical address corresponding to the first host address in the read forward lookup address translation table, determines that the user data in the first physical address is valid data when the first physical address matches the second physical address, and determines that the user data is invalid data when the first physical address does not match the second physical address, writes the user data determined as valid data by the address-translation-table comparing unit to a block to be a compaction destination, associates the first host address with a third physical address in which the user data determined as valid data in the block to be a compaction destination in the reverse lookup address translation table is written, and associates the third physical address with the first host address in the read forward lookup address translation table.

8. The memory system according to claim 7, wherein the reverse lookup address translation table is present for each block.

9. The memory system according to claim 8, wherein the memory stores address-translation-table storage location information indicating a location of the reverse lookup address translation table in the nonvolatile memory, and the controller reads the part of the reverse lookup address translation table to the memory on a basis of the address-translation-table storage location information.

10. The memory system according to claim 9, wherein the controller reads the address-translation-table storage location information stored in the nonvolatile memory to the memory.

11. The memory system according to claim 7, wherein when the address-translation-table comparing unit determines that the user data in the first physical address is invalid data, the controller determines whether there is a fourth physical address subsequent to the first physical address, and when there is the fourth physical address, the controller causes the address-translation-table comparing unit to determine whether the user data in the fourth physical address is valid data or not.

12. The memory system according to claim 11, wherein, when the fourth physical address does not exist, the controller selects a block to be a compaction source.

13. The memory system according to claim 12, wherein the invalid value has been written at a time of initialization.

14. The memory system according to claim 13, wherein the memory is a RAM.

15. The memory system according to claim 14, wherein the nonvolatile memory is a NAND type flash memory.

16. The memory system according to claim 7, wherein, before the third physical address is associated with the first host address, an invalid value is written in a host address corresponding to the third physical address in the reverse lookup address translation table.

17. A control method of a memory system that includes a nonvolatile semiconductor memory, the nonvolatile semiconductor memory including a plurality of blocks, each of the blocks being a unit of erasing, the method comprising:

receiving a plurality of write requests from outside the memory system, the write requests including data and an address;

determining whether a first condition is satisfied on a basis of addresses included in the write requests, the first condition being a condition in which a first state is detected consecutively for a first threshold number of times or more, the first state being detected when a difference is less than a second threshold, the difference being a difference between an end address of data specified by a last write request and a start address of data specified by a current write request;

determining that the block is used in a multi-value mode and writing data in the block in the multi-value mode when the first condition is satisfied; and determining that the block is used in a binary mode and writing data in the block in the binary mode when the first condition is not satisfied, wherein, even when a determination result of whether the first condition is satisfied changes while writing data to the block, switching of a recording mode is not performed until writing to the block is finished.

18. The method according to claim 17, further comprising:

determining whether a second condition that a write request in which a data size matches a predetermined value is received continuously a predetermined number of times or more is satisfied on a basis of addresses included in the write requests;

determining that the block is used in the multi-value mode and writing data in the block in the multi-value mode when the first condition and the second condition are satisfied; and determining that the block is used in the binary mode and writing data in the block in the binary mode when the first condition or the second condition is not satisfied.

19. The method according to claim 17, further comprising:

determining whether a third condition that a write request in which a remainder obtained by dividing a top address by a predetermined data size is zero is received continuously a predetermined number of times or more is satisfied on a basis of addresses included in the write requests;

determining that the block is used in the multi-value mode and writing data in the block in the multi-value mode when the first condition and the third condition are satisfied; and determining that the block is used in the binary mode and writing data in the block in the binary mode when the first condition or the third condition is not satisfied.

* * * * *